United States Patent
Hasegawa et al.

(10) Patent No.: US 7,106,560 B2
(45) Date of Patent: Sep. 12, 2006

(54) MAGNETIC SENSOR WITH SECOND ANTIFERROMAGNETIC LAYER HAVING SMALLER DEPTH IN HEIGHT DIRECTION THAN FREE LAYER

(75) Inventors: Naoya Hasegawa, Niigata-ken (JP); Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 352 days.

(21) Appl. No.: 10/619,341

(22) Filed: Jul. 14, 2003

(65) Prior Publication Data
US 2004/0012899 A1    Jan. 22, 2004

(30) Foreign Application Priority Data
Jul. 16, 2002    (JP)    ............................. 2002-206544

(51) Int. Cl.
*G11B 5/39* (2006.01)
(52) U.S. Cl. ................................. 360/324.12
(58) Field of Classification Search ............ 360/324.12
See application file for complete search history.

(56) References Cited
U.S. PATENT DOCUMENTS

| 6,181,532 B1 | 1/2001 | Dovek et al. |
| 6,239,955 B1 | 5/2001 | Dovek et al. |
| 6,266,218 B1 * | 7/2001 | Carey et al. ........... 360/324.12 |
| 6,381,107 B1 * | 4/2002 | Redon et al. ............ 360/324.2 |
| 6,716,537 B1 | 4/2004 | Kakihara |
| 6,822,836 B1 * | 11/2004 | Gill ........................ 360/324.12 |
| 6,913,836 B1 | 7/2005 | Hasegawa |

* cited by examiner

*Primary Examiner*—A. J. Heinz
(74) *Attorney, Agent, or Firm*—Brinks Hofer Gilson & Lione

(57) ABSTRACT

An end portion of a backfill gap layer is provided on two side portions of a free magnetic layer in a back region, and second antiferromagnetic layers are formed on the two side portions of the free magnetic layer from a face opposing a recording medium to the end portion of the backfill gap layer. Accordingly, in the free magnetic layer in the back region, a bias magnetic field in the magnetic layer is decreased as compared to that in the front region. Hence, a magnetic sensor can be manufactured which can improve the reproduction sensitivity of a central portion of the free magnetic layer to an external magnetic field as compared to that in the past without decreasing the exchange stiffness constant and which can suppress the generation of side reading.

8 Claims, 19 Drawing Sheets

FIG. 6
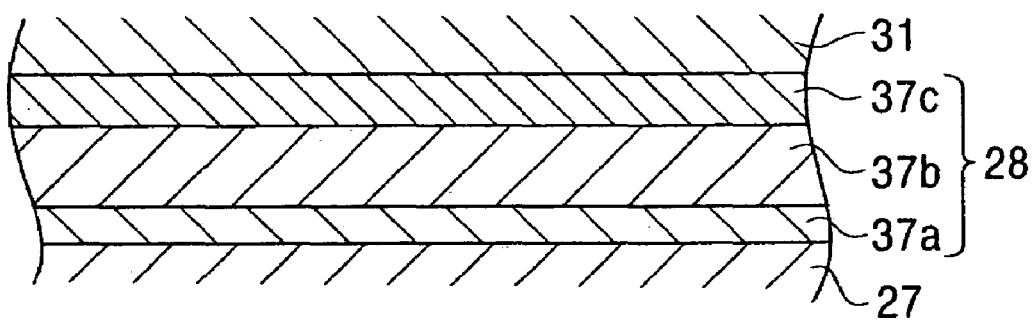
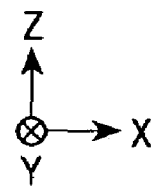
FIG. 7
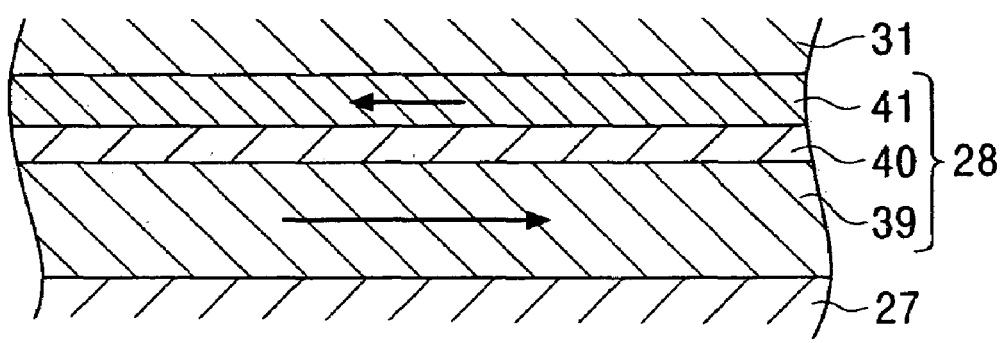
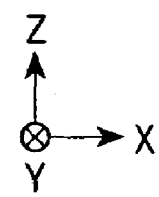

MAGNETIC SENSOR WITH SECOND ANTIFERROMAGNETIC LAYER HAVING SMALLER DEPTH IN HEIGHT DIRECTION THAN FREE LAYER

BACKGROUND OF THE INVENTION

1. Field of the Invention

The present invention primarily relates to magnetic sensors each performing magnetization control of a free magnetic layer by an exchange bias method, and more particularly, relates to a magnetic sensor and a manufacturing method thereof, the magnetic sensor capable of improving reproduction sensitivity even when a track width is decreased and of suppressing the generation of side reading.

2. Description of the Related Art

FIG. 20 is a partial cross-sectional view showing the structure of a conventional magnetic sensor, viewed from a face opposing a recording medium.

Reference numeral 1 indicates a first antiferromagnetic layer, and on the antiferromagnetic layer 1, a fixed magnetic layer 2, a non-magnetic material layer 3, and a free magnetic layer 4 are formed in that order, thereby forming a multilayer film 7.

In the magnetic sensor shown in FIG. 20, on two side portions 4a of the free magnetic layer 4, second antiferromagnetic layers 5 are formed, and in addition, on the second antiferromagnetic layers 5, electrode layers 6 are formed.

As shown in FIG. 20, a track width Tw is determined by the distance between the bottom surfaces of the second antiferromagnetic layers 5 in the track width direction (X direction in the figure).

FIG. 21 is a partial plan of the magnetic sensor shown in FIG. 20 viewed from directly overhead. In this plan view, the electrode layers 6 shown in FIG. 20 are omitted. As shown in FIG. 21, the second antiferromagnetic layers 5 are formed on the entire two side portions 4a of the free magnetic layer 4.

FIG. 22 is a partial, vertical cross-sectional view of the magnetic sensor shown in FIG. 20, which is taken along the chain line shown in FIG. 20 in the direction parallel to the Y-Z plane and which is viewed along the direction indicated by the arrow E.

As shown in FIG. 22, a back end surface 7a of the multilayer film 7 is an inclined surface, and in a back side region in a height direction (Y direction in the figure) further from the back end surface 7a in the height direction, an insulating layer 8 is formed. In addition, it is understood that the second antiferromagnetic layer 5 is formed over the multilayer film 7 and the insulating layer 8.

In the magnetic sensor shown in FIG. 20, when an exchange coupling magnetic field is generated between the second antiferromagnetic layer 5 and each side portion 4a of the free magnetic layer 4, the side portions 4a of the free magnetic layer 4 are magnetically fixed in the X direction in the figure. As shown in FIG. 21, the second antiferromagnetic layers 5 covers the entire side portions 4a of the free magnetic layer 4, and the magnetizations of the entire side portions 4a are tightly fixed in the X direction shown in the figure by the exchange coupling magnetic fields described above.

In addition, a central portion 4b of the free magnetic layer 4 is placed in a single domain state in the X direction in the figure, which may be influenced by an external magnetic field, and when an external magnetic field penetrates into the central portion 4b described above from the Y direction in the figure, the magnetization of the central portion 4b of the free magnetic layer 4 rotates, so that the external magnetic field is detected by the magnetoresistive effect.

However, when the track width Tw is decreased in order to meet the trend toward a higher recording density, in the magnetic sensor shown in FIG. 20, the following problem has occurred.

In a method in which the magnetization control of the free magnetic layer 4 shown in FIG. 20 is performed by an exchange bias method using the second antiferromagnetic layers 5, the magnetization of the central portion 4b of the free magnetic layer 4 is aligned in the X direction shown in the figure by a bias magnetic field generated by an exchange interaction acting between adjacent spin electrons inside the free magnetic layer 4.

However, as the track width is decreased, a region strongly influenced by the bias magnetic field described above is relatively increased in the central portion 4b, and as a result, the reproduction sensitivity of the free magnetic layer 4 to an external magnetic field is disadvantageously decreased. In particular, since the vicinity of each of two ends 4b1 of the central portion 4b of the free magnetic layer 4 is strongly influenced by the bias magnetic field described above, magnetization inversion is not properly performed with respect to the external magnetic field, and as a result, the reproduction sensitivity is decreased as the track width is decreased.

As a method for solving the problem described above, a method in which the free magnetic layer 4 is formed from a material having a small exchange stiffness constant may be considered.

The exchange stiffness constant is a constant defining the magnitude of exchange energy with respect to spin distribution, and when a magnetic material has a smaller exchange stiffness constant, it becomes easier to rapidly change the directions of adjacent spin electrons. The "exchange stiffness constant" has been described in detail by S. Chikazui in "Kyojisei no Butsuri (II) (Physics of Ferromagnetic Material (II))", pp. 166 to 169, (1984), published by Shokabo.

In order to improve the reproduction sensitivity, the exchange stiffness constant of the free magnetic layer 4 may be decreased as described above; however, when the exchange stiffness constant is excessively decreased, the Curie temperature is decreased, and as a result, thermal fluctuation of magnetization of the free magnetic layer 4 becomes a problem. As a result, the generation of Barkhausen noise or noise caused by ferromagnetic resonance induced by thermal fluctuation becomes serious.

In addition, when the exchange coupling magnetic field generated between the second antiferromagnetic layer 5 and the side portion 4a of the free magnetic layer 4 is decreased, the reproduction sensitivity can be improved. For example, when the film thickness of the second antiferromagnetic layer 5 is decreased, the exchange coupling magnetic field described above can be decreased.

However, when the exchange coupling magnetic field described above is decreased, the fixation of the magnetization of the side portion 4a is also decreased, and as a result, a problem of side reading may arise, which is generated by magnetization inversion in the side portion 4a caused by an external magnetic field.

Furthermore, there may also be mentioned a method for improving the reproduction sensitivity in which the film thickness of the free magnetic layer 4 is decreased so as to decrease the magnetic momentum (saturated magnetization Ms×film thickness t) per unit area of the free magnetic layer 4. However, when the film thickness of the free magnetic layer 4 is excessively decreased, a problem may arise in that the stability of reproduction waveforms is decreased or noise caused by thermal fluctuation is generated.

SUMMARY OF THE INVENTION

Accordingly, the present invention was made to solve the current problems described above, and an object of the present invention is to provide a magnetic sensor and manufacturing method thereof, the magnetic sensor capable of improving the reproduction sensitivity by an exchange bias method even when the track width is decreased and of suppressing the generation of side reading.

In accordance with one aspect of the present invention, a magnetic sensor comprises: a multilayer film having a first antiferromagnetic layer, a fixed magnetic layer, a nonmagnetic material layer, and a free magnetic layer in that order from the bottom; and second antiferromagnetic layers provided on two side portions of the free magnetic layer in a track width direction. In the magnetic sensor described above, back end surfaces of the second antiferromagnetic layers in a height direction, which are in regions in which exchange coupling magnetic fields are generated, are each located at least at a position closer to a face opposing a recording medium than a back end surface of a central portion of the free magnetic layer in the height direction, the central portion being located between the two side portions.

In the present invention, since the central portion of the free magnetic layer in a back region is not adjacent to regions of the second antiferromagnetic layer, in each of which the exchange coupling magnetic field is generated, at least in the central portion of the free magnetic layer in the back region along the height direction, a bias magnetic field generated by an exchange interaction in the magnetic layer can be decreased, and the sensitivity of the central portion of the free magnetic layer to an external magnetic field can be improved as compared to that in the past without decreasing the exchange stiffness constant of the free magnetic layer.

In addition, in the present invention, since the regions of the two side portions of the free magnetic layer, in which exchange coupling magnetic fields are generated with the second antiferromagnetic layers, are appropriately formed at positions close the face opposing a recording medium, the magnetizations of the regions of the two side portions of the free magnetic layer located close to the face opposing a recording medium are appropriately fixed in the track width direction, and as a result, problems such as the generation of side reading do not occur at all.

According to the present invention, even when the trend toward narrower track width is facilitated in order to appropriately accomplish higher recording density, a magnetic sensor can be manufactured which can improve the reproduction sensitivity of the free magnetic layer to an external magnetic field while the generation of side reading is suppressed, and which can improve reproduction output while the higher recording density is realized.

In addition, in the present invention, a third antiferromagnetic layer is preferably provided on the free magnetic layer, and as a result, the second antiferromagnetic layers are provided on the two side portions of the third antiferromagnetic layer in the track width direction.

In accordance with another aspect of the present invention, a magnetic sensor comprises: a multilayer film having a first antiferromagnetic layer, a fixed magnetic layer, a nonmagnetic material layer, and a free magnetic layer in that order from the bottom; an insulating layer extending on at least two side portions in a track width direction of the free magnetic layer in a back region along a height direction; and second antiferromagnetic layers provided on the two side portions of the free magnetic layer from a face opposing a recording medium to the insulating layer.

The magnetic sensor of the present invention is characterized in that the insulating layer extends on the two side portions of the free magnetic layer in the back region along the height direction, and that the second antiferromagnetic layers are formed on the two side portions from the face opposing a recording medium to the insulating layer.

In each side portion in a front region, which is a region closer to the face opposing a recording medium than the insulating layer, an exchange coupling magnetic field having an appropriate magnitude is generated between the free magnetic layer and the second antiferromagnetic layer, and the magnetization of each side portion of the free magnetic layer in the front region is appropriately fixed in the track width direction. On the other hand, in each side portion of the free magnetic layer in the back region, since the insulating layer is provided between the free magnetic layer and the second antiferromagnetic layer, the exchange coupling magnetic field is not generated therebetween, and hence, unlike that in the front region described above, the magnetization of the free magnetic layer in the back region is not tightly fixed in the track width direction.

As a result, in the free magnetic layer in the back region, a bias magnetic field generated by an interaction effect in the magnetic layer is decreased as compared to that in the front region, and because of the decreased bias magnetic field in the back region, the reproduction sensitivity of the central portion of the free magnetic layer to an external magnetic field can be improved as compared to that in the past.

In the case described above, when the bias magnetic field is decreased in each side portion of the free magnetic layer in the back region, the generation of side reading may occur in some cases. However, for example, because the external magnetic field is attenuated while traveling to the free magnetic layer in the back region, it is believed that the problem in that side reading is liable to occur as compared to that in the past may not substantially arise.

In particular, in the present invention, the magnetization of each side portion of the free magnetic layer in the front region is tightly fixed in the track width direction by the exchange coupling magnetic field generated between the free magnetic layer and the second antiferromagnetic layer. Since the magnetization state of each side portion of the free magnetic layer in the front region has a significant influence on the generation of side reading as compared to that in the back region, when the magnetization of each side portion of the free magnetic layer in the front region is appropriately fixed as in the present invention, the generation of side reading can be appropriately suppressed.

In addition, in the present invention, a third antiferromagnetic layer is preferably provided on the free magnetic layer. As a result, the insulating layer extends on the two side portions of the third antiferromagnetic layer in the back region along the height direction, and the second antiferromagnetic layers are provided on the two side portions of the third antiferromagnetic layer from the face opposing a recording medium to the insulating layer.

In the present invention, as described above, the third antiferromagnetic layer is provided on the free magnetic layer, and the second antiferromagnetic layers are provided on the two side portions of the third antiferromagnetic layer from the face opposing a recording medium in the front region to the insulating layer in the back region. Accordingly, the second antiferromagnetic layer and the third antiferromagnetic layer forms a thick antiferromagnetic layer on each side portion of the free magnetic layer in the front region, and by an exchange coupling magnetic field generated between the antiferromagnetic layer described above and the free magnetic layer, the magnetization of each side portion thereof in the front region is appropriately fixed in the track width direction. On the other hand, the central portion of the free magnetic layer is put in a single domain state so that the magnetization thereof may rotate when an external magnetic field is applied.

In the present invention, the insulating layer preferably extends in the height direction further from the back end surface of the multilayer film in the height direction. By this structure, a step of manufacturing the insulating layer can be simplified. In addition, this insulating layer is also called a backfill gap layer.

In addition, in the present invention, a nonmagnetic layer is preferably provided between the insulating layer and the free magnetic layer in the thickness direction or between the third antiferromagnetic layer and the insulating layer. The nonmagnetic layer preferably comprises at least one element selected from the group consisting of ruthenium (Ru), rhenium (Re), palladium (Pd), osmium (Os), iridium (Ir), platinum (Pt), gold (Au), rhodium (Rh), and chromium (Cr). The nonmagnetic layer serves as an antioxidant film for preventing a layer provided thereunder from being oxidized.

In the present invention, the third antiferromagnetic layer is preferably formed so as to have a thickness of 20 to 50 Å. By this thickness, a large exchange coupling magnetic field is not generated between the central portion of the free magnetic layer and the third antiferromagnetic layer, and the magnetization of the central portion of the free magnetic layer is prevented from being tightly fixed.

In accordance with another aspect of the present invention, a method for manufacturing a magnetic sensor, comprises the steps of; (a) forming a multilayer film composed of a first antiferromagnetic layer, a fixed magnetic layer, a nonmagnetic material layer, and a free magnetic layer in that order from the bottom; (b) providing an insulating layer on two side portions in a track width direction of the free magnetic layer in a back region along a height direction; and (c) forming second antiferromagnetic layers on the two side portions of the free magnetic layer from a face opposing a recording medium to the insulating layer.

By the above steps (a) to (c), the insulating layer can be provided on the two side portions of the free magnetic layer in the back region, and the second antiferromagnetic layers can also be formed on the two side portions of the free magnetic layer from the face opposing a recording medium to the insulating layer. Accordingly, a magnetic sensor can be easily and appropriately manufactured which has a high reproduction sensitivity of the central portion of the free magnetic layer as compared to that in the past and which can appropriately suppress the generation of side reading.

In accordance with another aspect of the present invention, a method for manufacturing a magnetic sensor, comprises the steps of; (d) forming a multilayer film composed of a first antiferromagnetic layer, a fixed magnetic layer, a nonmagnetic material layer, a free magnetic layer, a third antiferromagnetic layer, and a nonmagnetic layer in that order from the bottom; (e) forming a back end surface of the multilayer film in a height direction into a predetermined shape; (f) forming an insulating layer on the multilayer film in a back region in the height direction and in a region extending further from the back end surface in the height direction; (g) grinding an exposed part of the nonmagnetic layer, which is not provided with the insulating layer thereon; (h) forming a solid second antiferromagnetic layer over the third antiferromagnetic layer and the insulating layer; and (i) forming mask layers on the solid second antiferromagnetic layer at positions which correspond to two side portions of the third antiferromagnetic layer in a track width direction, followed by grinding a central portion of the solid second antiferromagnetic layer in a track width direction, which is not covered with the mask layers, so as to form second antiferromagnetic layers on the two side portions from a face opposing a recording medium to the insulating layer provided on the third antiferromagnetic layer in the back region in the height direction.

By the above steps (d) to (i), the insulating layer can be easily provided on appropriate positions of the two side portions of the free magnetic layer in the back region, a large exchange coupling magnetic field can be generated between each side portion of the free magnetic layer in the front region and the third antiferromagnetic layer, and hence the magnetization of each side portion of the free magnetic layer in the front region can be appropriately fixed. In addition, since the second antiferromagnetic layers are formed above the two side portions of the third antiferromagnetic layer, which is formed on the free magnetic layer, in the back region with the insulating layer provided therebetween, the third antiferromagnetic layer and the second antiferromagnetic layer does not function as an integrated antiferromagnetic layer, and as a result, the exchange coupling magnetic field is not generated in each side portion of the free magnetic layer in the back region. Accordingly, the bias magnetic field generated by an exchange interaction in the free magnetic layer in the back region is decreased, and hence a magnetic sensor can be easily and appropriately manufactured which has high reproduction sensitivity of the central portion of the free magnetic layer as compared to that in the past and which can appropriately suppress the generation of side reading.

In the present invention, the nonmagnetic layer preferably comprises at least one element selected from the group consisting of Ru, Re, Pd, Os, Ir, Pt, Au, Rh, and Cr, and in addition, the nonmagnetic layer preferably has a thickness of 3 to 10 Å in a film forming step. When the thickness is small as described above, the film thickness of the nonmagnetic layer can be easily adjusted by low-energy ion milling, and a layer provided thereunder may not be damaged by this ion milling at all.

In addition, in the present invention, the third antiferromagnetic layer is preferably formed to have a thickness of 20 to 50 Å. In the present invention, the third antiferromagnetic layer is not preferably formed to have an excessively large thickness. The reason for this is as follows. When the third antiferromagnetic layer is formed to have a large thickness, since ordering is likely to occur therein in annealing in a magnetic field, a large exchange coupling magnetic field is generated even between the central portion of the free magnetic layer and that of the third antiferromagnetic layer, and as a result, the magnetization of the central portion of the free magnetic layer is fixed.

BRIEF DESCRIPTION OF THE DRAWINGS

FIG. 6 is a partial, enlarged cross-sectional view of the structure of a free magnetic layer according to the present invention, the free magnetic layer viewed from a face opposing a recording medium;

FIG. 7 is a partial, enlarged cross-sectional view of the structure of another free magnetic layer according to the present invention, the free magnetic layer viewed from a face opposing a recording medium;

DESCRIPTION OF THE PREFERRED EMBODIMENTS

Figure 1:
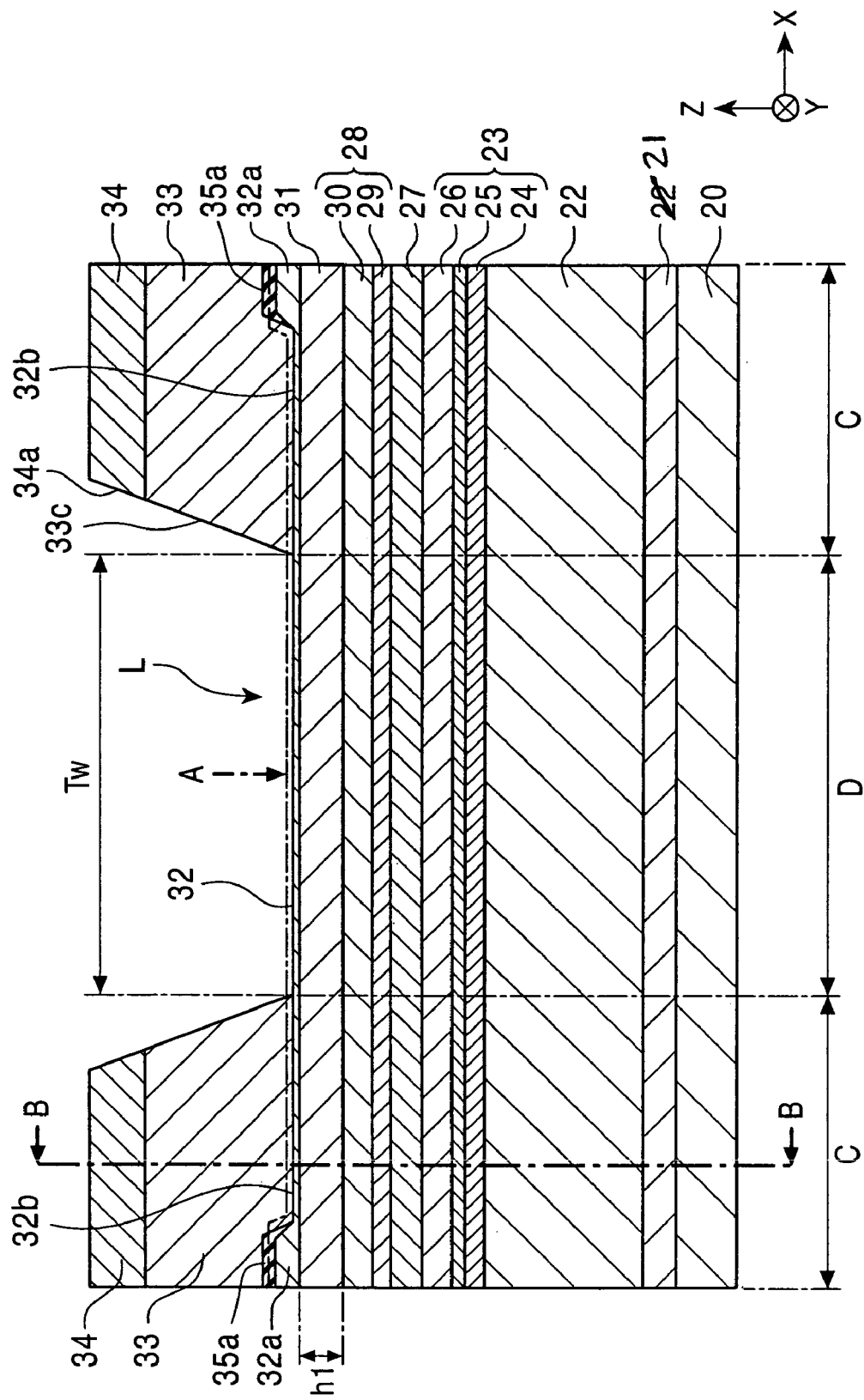
FIG. 1 is a partial cross-sectional view of the structure of a magnetic sensor according to an embodiment of the present invention, the magnetic sensor viewed from a face opposing a recording medium.

FIG. 1 is a partial cross-sectional view showing the structure of a magnetic sensor (spin-valve type thin film element) of the present invention, which is viewed from a face opposing a recording media.

Reference numeral 20 indicates a substrate. On the substrate 20, a seed layer 21 composed of a NiFe alloy, a NiFeCr alloy, or Cr is formed. The seed layer 21 is a film, for example, composed of 60 atomic percent of $(Ni_{0.8}Fe_{0.2})$ and 40 atomic percent of Cr and having a thickness of 60 Å.

On the seed layer 21, a first antiferromagnetic layer 22 is formed. The first antiferromagnetic layer 22 is formed of a PtMn alloy, an X—Mn alloy (where X is at least one element selected from the group consisting of Pd, Ir, Rh, Ru, Os, nickel (Ni), and iron (Fe)), or a Pt—Mn—X' alloy (where X' is at least one element selected from the group consisting of Pd, Ir, Rh, Ru, Au, Ag, Os, Cr, Ni, argon (Ar), neon (Ne), xenon (Xe), and krypton (Kr)).

As the first antiferromagnetic layer 22, when the alloy described above is processed by heat treatment, an exchange coupling film, composed of the first antiferromagnetic layer 22 and a fixed magnetic layer 23, can be obtained which generates a large exchange coupling magnetic field. In particular, when a PtMn alloy is used, an exchange coupling film, composed of the first antiferromagnetic layer 22 and the fixed magnetic layer 23, can be obtained which has an exchange coupling magnetic field of 48 kA/m or more, for example, more than 64 kA/m, and an extremely high blocking temperature of 380° C. at which the exchange coupling magnetic field mentioned above disappears.

Each of these alloys described above has an irregular face-centered cubic structure (fcc) right after film formation and is transformed into a CuAuI type regular face-centered cubic structure (fcc) by heat treatment.

The film thickness of the first antiferromagnetic layer 22 is 80 to 300 Å in the vicinity of the center in the track width direction.

On the first antiferromagnetic layer 22, the fixed magnetic layer 23 is formed. The fixed magnetic layer 23 has an artificial ferrimagnetic structure. The fixed magnetic layer 23 has a three-layer structure composed of magnetic layers 24 and 26 and a nonmagnetic interlayer 25 provided therebetween.

The magnetic layers 24 and 26 are formed of a magnetic material, such as a NiFe alloy, cobalt (Co), a CoNiFe alloy, a CoFe alloy, or a CoNi alloy. The magnetic layers 24 and 26 are preferably formed of the same material.

In addition, the nonmagnetic interlayer 25 is formed of a nonmagnetic material comprising at least one of Ru, Rh, Ir, Cr, Re, copper (Cu), and an alloy containing at least one element mentioned above. In particular, the nonmagnetic interlayer 25 is preferably formed of Ru.

On the fixed magnetic layer 23, a nonmagnetic material layer 27 is formed. The nonmagnetic material layer 27 is a layer which interferes with magnetic coupling between the fixed magnetic layer 23 and a free magnetic layer 28, which allows a sense current to primarily flow therethrough, and which is preferably formed of a conductive nonmagnetic material such as Cu, Cr, Au, or Ag. In particular, the nonmagnetic material layer 27 is preferably formed of Cu.

On the nonmagnetic material layer 27, the free magnetic layer 28 is formed. In the embodiment shown in FIG. 1, the free magnetic layer 28 has a two-layer structure. Reference numeral 29 indicates a diffusion-blocking layer formed of Co, CoFe, or the like. This diffusion-blocking layer 29 inhibits the mutual diffusion between the free magnetic layer 28 and the nonmagnetic material layer 27. In addition, on this diffusion-blocking layer 29, a magnetic material layer 30 formed of a NiFe alloy or the like is provided.

On the free magnetic layer 28, a third antiferromagnetic layers 31 is formed. As is the first antiferromagnetic layer 22, the third antiferromagnetic layer 31 is formed of a PtMn alloy, an X—Mn alloy (where X is at least one element selected from the group consisting of Pd, Ir, Rh, Ru, Os, Ni, and Fe), or a Pt—Mn—X' alloy (where X' is at least one element selected from the group consisting of Pd, Ir, Rh, Ru, Au, Ag, Os, Cr, Ni, Ar, Ne, Xe, and Kr).

In the embodiment shown in FIG. 1, on the third antiferromagnetic layer 31, a nonmagnetic layer 32 is formed. In addition, on two side portions C of the nonmagnetic layer 32, second antiferromagnetic layers 33 are formed. As are the first antiferromagnetic layer 22 and the third antiferromagnetic layer 31, the second antiferromagnetic layer 33 is formed of a PtMn alloy, an X—Mn alloy (where X is at least one element selected from the group consisting of Pd, Ir, Rh, Ru, Os, Ni, and Fe), or a Pt—Mn—X' alloy (where X' is at least one element selected from the group consisting of Pd, Ir, Rh, Ru, Au, Ag, Os, Cr, Ni, Ar, Ne, Xe, and Kr). The second antiferromagnetic layer 33 and the third antiferromagnetic layer 31 are preferably formed of the same material.

In addition, on each second antiferromagnetic layer 33, an electrode layer 34 is formed. The electrode layer 34 is formed, for example, of Au, tungsten (W), Cr, Ru, tantalum (Ta), or Rh.

In the embodiment shown in FIG. 1, inside end surfaces 33c of the second antiferromagnetic layers 33 and inside end surfaces 34a of the electrode layers 34 are formed into inclined surfaces or curved surfaces so that the distance between the second antiferromagnetic layers 33 is gradually increased from the bottom to the top (Z direction in the figure).

Characteristic points of the magnetic sensor of the embodiment shown in FIG. 1 will be described with reference to FIGS. 2 and 3.

Figure 2:
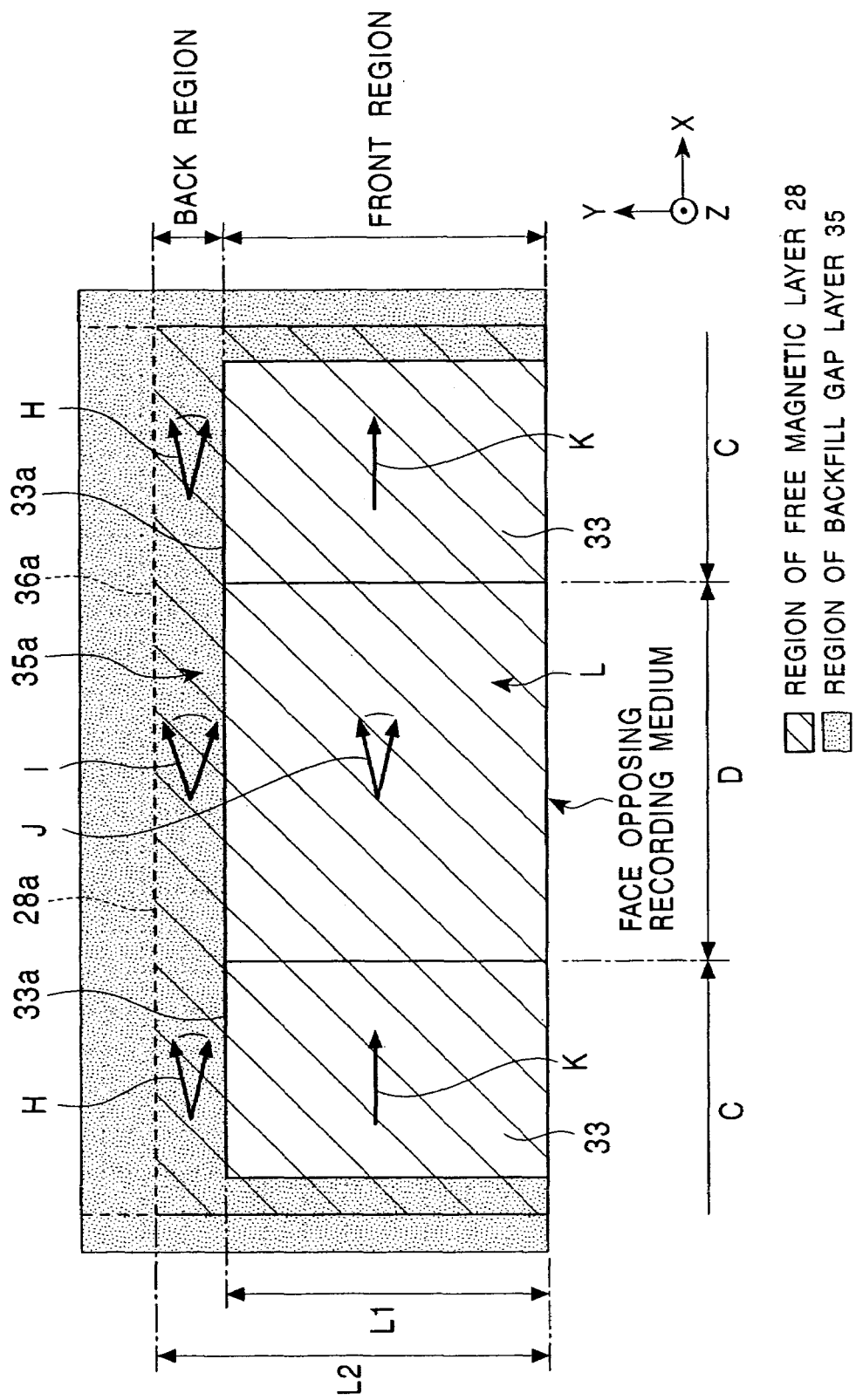
FIG. 2 is a partial plan view of the magnetic sensor shown in FIG. 1 taken along the chain line in the direction parallel to the X-Y plane, the magnetic sensor viewed along the direction indicated by the arrow A.

FIG. 2 is a partial plan view of the magnetic sensor shown in FIG. 1 taken along the chain line in the direction parallel to the X-Y plane, the magnetic sensor viewed along the direction indicated by the arrow A.

The lower side shown in FIG. 2 is the face opposing a recording medium, and the upper side in the figure (Y direction in the figure) is a height direction. A region shown by oblique lines in FIG. 2 indicates a region in which the free magnetic layer 28 is formed, and a deep color region indicates a region in which a backfill gap layer (insulating layer) 35 is formed.

Figure 3:
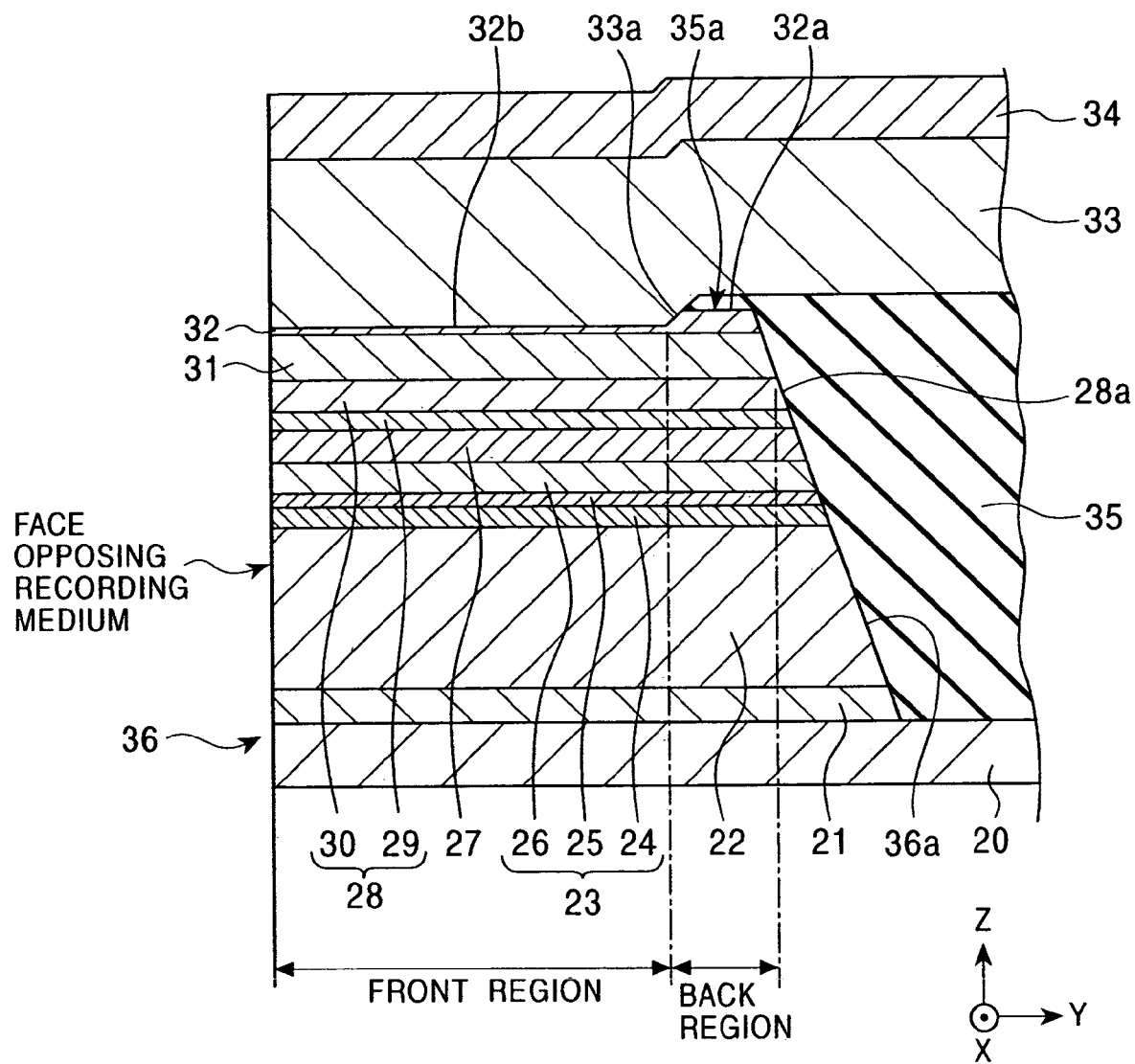
FIG. 3 is a partial, vertical cross-sectional view of the magnetic sensor shown in FIG. 1 taken along the dotted line in the direction parallel to the Y-Z plane, the magnetic sensor viewed along the direction indicated by the arrow B.

In addition, FIG. 3 is a partial, vertical cross-sectional view of the magnetic sensor shown in FIG. 1 taken along the dotted line in the direction parallel to the Y-Z plane, the magnetic sensor viewed along the direction indicated by the arrow B.

As can be seen from FIGS. 1 to 3, the second antiferromagnetic layers 33 are each formed above the side portion C of the third antiferromagnetic layer 31 formed on the free magnetic layer 28 and are each even formed on the backfill gap layer (insulating layer) 35, which extends in the height direction (Y direction in the figure) further from a back end surface 36a of a multilayer film 36 in the height direction formed of the seed layer 21 to the nonmagnetic layer 32.

As can be seen from FIGS. 2 and 3, above the side portions C of the third antiferromagnetic layer 31 in a back region in the height direction, an end portion 35a of the backfill gap layer 35 is formed, and the second antiferromagnetic layers 33 are formed thereon.

That is, in the embodiment shown in FIGS. 1 to 3, the second antiferromagnetic layers 33 are formed above the side portions C of the third antiferromagnetic layer 31 from the face opposing a recording medium in a front region and also formed above the end portion 35a of the backfill gap layer 35 formed in the back region described above. In addition, the distance between the side portion C of the third antiferromagnetic layer 31 in the back region and the second antiferromagnetic layer 33 is larger than that between the side portion C of the third antiferromagnetic layer 31 in the front region and the second antiferromagnetic layers 33.

Each of the side portions C of the third antiferromagnetic layer 31 in the front region functions as an integrated antiferromagnetic layer together with the second antiferromagnetic layer 33 formed thereon, and between the side portion C of the third antiferromagnetic layer 31 in the front region and the free magnetic layer 28, an exchange coupling magnetic field having an appropriate magnitude is generated, whereby magnetization K of the side portion C of the free magnetic layer 28 in the front region is tightly fixed in the track width direction (X direction in the figure) as shown in FIG. 2.

In addition, above each side portion C of the third antiferromagnetic layer 31 in the back region, the second antiferromagnetic layer 33 is formed with the end portion 35a of the backfill gap layer 35 provided therebetween, and as a result, an antiferromagnetic interaction between the third antiferromagnetic layer 31 and the second antiferromagnetic layer 33 is not generated, so that the function as an integrated antiferromagnetic layer cannot be obtained. As described later, since a film thickness h1 of the third antiferromagnetic layer 31 is small, such as 20 to 50 Å, the third antiferromagnetic layer 31 itself will not have antiferromagnetic characteristics. As a result, between the side portion C of the third antiferromagnetic layer 31 in the back region and the free magnetic layer 28, the exchange coupling magnetic field is not generated, and hence, the magnetization of the side portion C of the free magnetic layer 28 in the back region is not tightly fixed in the X direction shown in the figure.

The embodiment shown in FIGS. 1 to 3 is characterized in that each side portion C of the free magnetic layer 28 in the back region is not tightly fixed in the X direction shown in the figure unlike that in the front region, and that a bias magnetic field by the exchange interaction generated in the magnetic layer is decreased as compared to that in the past so that the single domain state thereof may be influenced by an external magnetic field. In addition, as shown in FIG. 2, it is believed that magnetization H of each side portion C of the free magnetic layer 28 in the back region is slightly shifted when an external magnetic field penetrates thereinto from the Y direction shown in the figure.

Since the bias magnetic field of each side portion C of the free magnetic layer 28 in the back region is decreased, a smaller bias magnetic field acts at a central portion D of the free magnetic layer 28 in the back region. In other words, since the second antiferromagnetic layer 33 formed on each side portion C and the central portion D of the free magnetic layer 28 in the back region are not adjacent to each other in the thickness direction, a strong bias magnetic field as is in the past is not generated, and as a result, magnetization I of the central portion D of the free magnetic layer 28 in the back region is placed in a single domain state which may be likely to be influenced by an external magnetic field as compared to that in the past. In particular, the magnetization I of the central portion D in the back region is likely to be shifted by a small bias magnetic field as compared to magnetization J of the central portion D of the free magnetic layer 28 in the front region (in FIG. 2, an angle of the magnetization I, indicating the magnetization shift, is shown larger than that of the magnetization J), and on the whole, since the magnetization of the central portion D of the free magnetic layer 28 is likely to rotate in response to an external magnetic field as compared to that of each of the entire side portions C of the free magnetic layer 28, which is tightly fixed by an exchange coupling magnetic field generated between the free magnetic layer 28 and the second antiferromagnetic layer 33, the reproduction sensitivity can be improved.

In the embodiment shown in FIGS. 1 to 3, when a bias magnetic field acting at the free magnetic layer 28 in the back region is decreased to be smaller than that in the past, the reproduction sensitivity of the central portion D of the free magnetic layer 28 can be improved.

As shown in FIGS. 1 to 3, when means is used which improves the reproduction sensitivity by decreasing the bias magnetic field acting at the free magnetic layer 28 in the back region, the exchange stiffness constant thereof is not decreased, and in addition, the exchange coupling magnetic field generated between the free magnetic layer 28 and each side portion C of the third antiferromagnetic layer 31 in the front region is not decreased.

As described above, when an external magnetic field penetrates into the free magnetic layer 28 from the Y direction in the figure, the magnetization H of each side portion C of the free magnetic layer 28 in the back region may rotate to some extent in some cases; however, it is believed that side reading is not liable to occur thereby.

Among the reasons for that, the first one is that the most important part of a magnetization control region for suppressing the generation of side reading is each side portion C of the free magnetic layer 28 in the front region. The reason for this is that the part described above is most likely to be influenced by an external magnetic field, and as shown in FIG. 2, in this embodiment, the magnetization of each side portion C of the free magnetic layer 28 in the front region is tightly fixed in the X direction shown in the figure. Hence, the structure is formed in which the generation of side reading can be appropriately suppressed.

The second reason is that even when an external magnetic field penetrates from the Y direction shown in the figure, since the external magnetic field is decreased until it reaches each side portion C of the free magnetic layer 28 in the back region, the magnitude of the external magnetic field for shifting the magnetization H in the back region is significantly decreased, and as a result, it is believed that the magnetization shift, which can generate side reading, does not occur.

The third reason is that since the exchange coupling magnetic field is not substantially generated in each side portion C of the free magnetic layer 28 in the back region, a small bias magnetic field only acts as compared to that in each side portion C in the front region; however, since the side portion C in the front region and that in the corresponding back region are adjacent to each other, the bias magnetic field in the back region is not so small as compared to that of the central portion D in the back region. Accordingly, it is believed that, even when a very small external magnetic field penetrates into the back region described above, the free magnetic layer 28 is put in a single domain state so that the magnetization shift will not substantially occur.

By the reasons described above, according to the magnetic sensor shown in FIGS. 1 to 3, it is believed that the generation of side reading can be appropriately suppressed.

According to the magnetic sensor shown in FIGS. 1 to 3, even when the track width Tw is particularly decreased in order to meet the trend towards the higher recording density, a magnetic sensor can be manufactured which can improve the reproduction sensitivity and which can also appropriately suppress the generation of side reading.

The track width Tw shown in FIG. 1 (the track width Tw described above is restricted by the distance between the bottom surfaces of the second antiferromagnetic layers 33 in the track width direction (X direction in the figure)) is preferably very small, such as 0.1 to 0.2 μm, and the present invention can be effectively applied to a magnetic sensor having the track width Tw as described above.

Next, the definitions of the "front region" and the "back region" shown in FIG. 2 will be described. In FIG. 2, the "back region" is defined as a region in which the end portion 35a of the backfill gap layer 35 is provided above the third antiferromagnetic layer 31, and the "front region" is defined as a region closer to the face opposing a recording medium than the "back region".

Alternatively, as the definitions different from those described above, the "front region" is defined as a region in which the second antiferromagnetic layer 33 functions as an integrated antiferromagnetic layer together with the third antiferromagnetic layer 31 and generates an exchange coupling magnetic field with the free magnetic layer 28, and the "back region" is defined as a region in which the exchange coupling magnetic field described above is not generated.

According to the different definitions described above, the magnetic sensor shown in FIGS. 1 to 3 may be defined as a sensor having the structure in which a back end surface 33a of each of the second antiferromagnetic layers 33 in the height direction, which is in a region in which the exchange coupling magnetic field is generated, is located at a position closer to the face opposing a recording medium than a back end surface 28a of the free magnetic layer 28 in the height direction.

In the embodiment shown in FIGS. 1 to 3, a length L1 of the "front region" in the height direction (Y direction in the figure) is preferably equivalent to 70% to 80% of a length L2 of the free magnetic layer 28 in the height direction (Y direction in the figure). Alternatively, a particular value of the length L1 is preferably more than 0.03 μm. When the length L1 of the "front region" in the height direction is 0.03 μm or less, since the rate of attenuation in leak magnetic field from a recording medium is decreased until it reaches the "back region", the magnetization H in the back region is likely to rotate. Accordingly, side reading is liable to occur, and hence the length L1 is preferably more than 0.03 μm.

In the magnetic sensor shown in FIGS. 1 to 3, the third antiferromagnetic layer 31 is provided on the free magnetic layer 28; however, the third antiferromagnetic layer 31 may not be provided. That is, the end portion 35a of the backfill gap layer 35 may be provided on each side portion C of the free magnetic layer 28 in the back region, and the second antiferromagnetic layer 33 may be formed over each side portion C of the free magnetic layer 28 in the front region and the end portion 35a of the backfill gap layer 35.

However, the third antiferromagnetic layer 31 is preferably formed on the free magnetic layer 28. The third antiferromagnetic layer 31 is a layer necessary for generating an exchange coupling magnetic field having an appropriate magnitude with the free magnetic layer 28 in each side portion C in the front region. As described later in a manufacturing method, in a film forming step, the third antiferromagnetic layer 31 is successively formed on the free magnetic layer 28, and in addition, the second antiferromagnetic layer 33 is formed above each side portion C of the third antiferromagnetic layer 31 in the front region. As a result, the second antiferromagnetic layer 33 and each side portion C of the third antiferromagnetic layer 31 in the front region may be able to serve as an integrated antiferromagnetic layer, and hence an exchange coupling magnetic field having an appropriate magnitude can be generated with each side portion C of the free magnetic layer 28 in the front region.

However, the film thickness h1 of the third antiferromagnetic layer 31 is preferably small, such as 20 to 50 Å, and more preferably in the range of from 30 to 40 Å. When the thickness is small as described above, ordered transformation is unlikely to occur in the central portion D of the third antiferromagnetic layer 31 even by annealing in a magnetic field, and the exchange coupling magnetic field is not generated between the central portion D of the third antiferromagnetic layer 31 and that of the free magnetic layer 28, or even if it is generated, the magnitude is small. When a large exchange coupling magnetic field is generated at the central portion D of the free magnetic layer 28, the central portion D thereof is magnetically fixed, and hence, in order to prevent the fixation described above, the third antiferromagnetic layer 31 is formed so as to have a small thickness of 20 to 50 Å.

In addition, the total thickness of the second antiferromagnetic layer 33 and each side portion C of the third antiferromagnetic layer 31 in the front region is preferably 80 to 300 Å. By this thickness, each side portion C of the third antiferromagnetic layer 31 in the front region has appropriate antiferromagnetic characteristics, ordered transformation occurs in each side portion C of the third antiferromagnetic layer 31 in the front region, the exchange coupling magnetic field is generated between each side portion C of the third antiferromagnetic layer 31 in the front region and the corresponding side portion C of the free magnetic layer 28 in the front region, and as a result, each side portion C of the free magnetic layer 28 in the front region can be magnetically fixed in the track width direction.

Next, the nonmagnetic layer 32 will be described. As described later in the manufacturing method, the nonmagnetic layer 32 is provided to serve as a protection layer in order to prevent the third antiferromagnetic layer 31 from being oxidized when it is exposed to the air.

The nonmagnetic layer 32 is preferably formed of at least one element selected from the group consisting of Ru, Re, Pd, Os, Ir, Pt, Au, Rh, and Cr. Among those mentioned above, Ru is particularly preferable. The nonmagnetic layer 32 formed of the noble metal mentioned above is unlikely to be oxidized even when exposed to the air. In addition, even when the noble metal forming the nonmagnetic layer 32 is diffused in the third antiferromagnetic layer 31 or the second antiferromagnetic layer 33, the antiferromagnetic characteristics thereof are not degraded.

Whether the element forming the nonmagnetic layer 32 is diffused into the third antiferromagnetic layer 31 or the second antiferromagnetic layer 33 may be determined, for example, by EDX analysis using a SIMS analyzer or a transmission electron microscope (TEM). In film forming steps, for example, when the third antiferromagnetic layer 31 is formed of a PtMn alloy, and the nonmagnetic layer 32 is formed of Ru, a diffusion layer made of a Ru—Pt—Mn alloy is formed in the diffusion region by annealing in a magnetic field or the like. The Ru—Pt—Mn alloy serves appropriately as an antiferromagnetic layer.

Next, the thickness of the nonmagnetic layer 32 will be described. The nonmagnetic layer 32 is formed so as to have a small thickness in the range of from 3 to 10 Å in a film forming step. Since the nonmagnetic layer 32 formed of the Ru described above is a dense layer unlikely to be oxidized even when exposed to the air, the nonmagnetic layer 32 having a small thickness can even appropriately prevent the third antiferromagnetic layer 31 from being oxidized in the air.

The end portion 32a of the nonmagnetic layer 32, which remains between the third anti ferromagnetic layer 31 and the end portion 35a of the backfill gap layer 35, maintains the original film thickness obtained in the film forming step. The reason for this is that the end portion 32a of the nonmagnetic layer 32 is not influenced by ion milling.

Accordingly, in addition to the end portion 35a of the backfill gap layer 35, since the end portion 32a of the nonmagnetic layer 32 having a thickness of 3 to 10 Å is also provided on each side portion C of the third antiferromagnetic layer 31 in the back region, the distance between each side portion C of the third antiferromagnetic layer 31 in the back region and the second antiferromagnetic layer 33 can be effectively increased. Hence, the exchange coupling magnetic field is appropriately prevented from being generated between each side portion C of the third antiferromagnetic layer 31 in the back region and the free magnetic layer 28.

In addition, when the end portion 35a of the backfill gap layer 35 has a small thickness, the end portion 35a may be removed by ion milling, which will be described later, and a thick end portion 32a of the nonmagnetic layer 32 may only remain in some cases. Even in this case, since the thick nonmagnetic layer 32 is interposed between the third antiferromagnetic layer 31 and the second antiferromagnetic layer 33, both layers do not function as an integrated antiferromagnetic layer, and hence the same effect as described above can be obtained.

In addition, as shown in FIGS. 1 and 2, in an area having a length L formed between the second antiferromagnetic layers 33, the nonmagnetic layer 32 remains, and the thickness thereof is smaller than that of the end portion 32a of the nonmagnetic layer 32. In this case, the nonmagnetic layer 32 provided in the area having the length L mentioned above and nonmagnetic layers 32b (parts of the nonmagnetic layer 32, on each of which the second antiferromagnetic layer 33 is formed) may not be formed.

The thickness of the nonmagnetic layer 32 in the area other than the end portion 32a formed under the end portion 35a of the backfill gap layer 35 is decreased by the influence of ion milling. In addition, when the thickness of the nonmagnetic layer 32b on which the second antiferromagnetic layer 33 is provided is decreased to 3 Å or less as described above, the second antiferromagnetic layer 33 and the third antiferromagnetic layer 31 may be able to function as an integrated antiferromagnetic layer.

The reason the nonmagnetic layer 32 having a very small thickness such as 3 Å or less is obtained is that low-energy ion milling is used. The nonmagnetic layer 32 is formed to have a small thickness of 3 to 10 Å in the film forming step.

Hence, even by low-energy ion milling, the film thickness of the nonmagnetic layer 32 can be adjusted. In addition, because of low energy, the milling rate is slow as compared to that in the case of high energy, and control can be relatively easily performed so that the milling may be stopped after the nonmagnetic layer 32 is partly ground.

In addition, as shown in FIGS. 1 and 2, although not provided above the central portion D of the free magnetic layer 28 in the front region, the second antiferromagnetic layer 33 may be formed so as to have a small thickness. In this case, the thickness of the second antiferromagnetic layer 33 which remains above the central portion D is adjusted so that the total thickness of the second antiferromagnetic layer 33 and the third antiferromagnetic layer 31 is 50 Å or less. By this adjustment, the exchange coupling magnetic field is not generated between the free magnetic layer 28 and the central portion D of the third antiferromagnetic layer 31 in the front region, or even when generated, the magnitude thereof is small, and hence the magnetization of the central portion D of the free magnetic layer 28 in the front region is not tightly fixed.

As shown in FIGS. 2 and 3, the backfill gap layer 35 is formed to extend in the height direction further from the back end surface 36a of the multilayer film 36 in the height direction, and according to the structure described above, the end portion 35a of the backfill gap layer 35 can be easily and appropriately formed on the multilayer film 36 in the manufacturing process described later.

Figure 4:
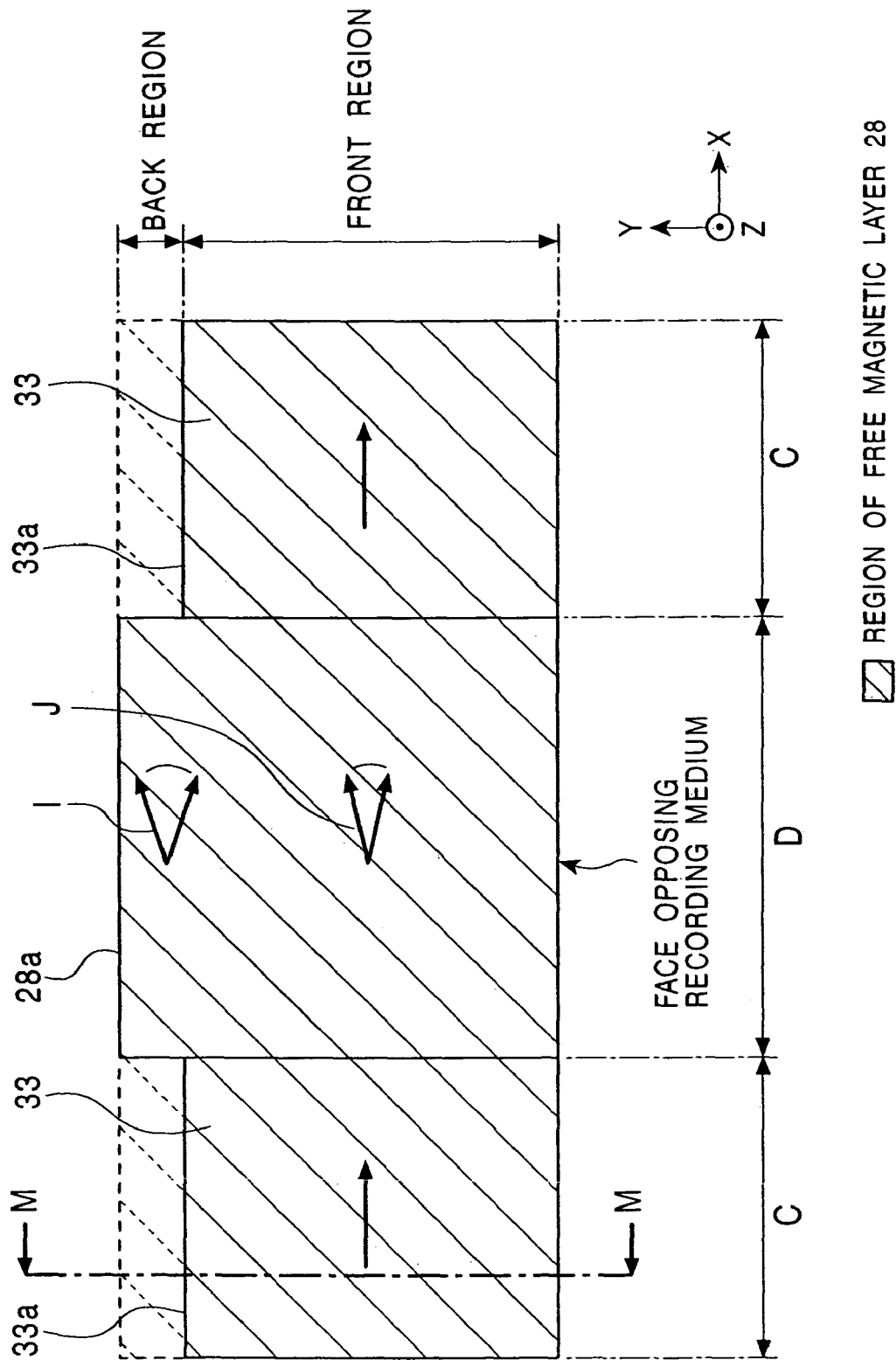
FIG. 4 is a partial plan view of the structure of a magnetic sensor according to another embodiment of the present invention, the magnetic sensor viewed from directly overhead.

FIG. 4 is a partial plan view showing the structure of another magnetic sensor of the present invention. In the magnetic sensor shown in FIG. 4, unlike the previous free magnetic layer 28 described above, the central portion D of the free magnetic layer 28 in the back region is formed to protrude from the side portions C thereof in the height direction (Y direction in the figure), the second antiferromagnetic layers 33 overlap the entire side portions C of the free magnetic layer 28 in the film thickness direction, and the magnetizations thereof are tightly fixed in the X direction in the figure. That is, in other words, in the magnetic sensor shown in FIG. 4, the back end surfaces 33a of the second antiferromagnetic layers 33 in the height direction, which are in regions in which exchange coupling magnetic fields are generated, are each located at a position closer to the face opposing a recording medium than the back end surface 28a of the central portion D of the free magnetic layer 28 in the height direction.

In FIG. 4, since the central portion D of the free magnetic layer 28 in the back region protrudes in the height direction (Y direction in the figure), the bias magnetic field by an exchange interaction generated in the magnetic layer is decreased in this back region, and the magnetization I of the central portion D in the back region is likely to rotate as compared to the magnetization J in the front region. Accordingly, on the whole, the reproduction sensitivity of the central portion D of the free magnetic layer 28 can be improved as compared to that in the past. In addition, since the magnetization of each side portion C of the free magnetic layer 28 is substantially fixed in the X direction in the figure, side reading may not occur at all.

In FIG. 4, the side portions C of the free magnetic layer 28 are not formed in the back region in the height direction unlike the central portion D described above; however, as shown by dotted lines, the side portions C are preferably formed to extend to the back region in the height direction so as to be aligned with the central portion D in the track width direction (X direction in the figure). The reason for this is to appropriately put the central portion D of the free magnetic layer 28 in the back region in a single domain state, and in order to place the magnetization of the central portion D of the free magnetic layer 28 in the back region is appropriately put in a single domain state in the X direction in the figure, the side portions C of the free magnetic layer 28 are preferably formed to extend to the back region so that bias magnetic fields are applied to the central portion D in the back region from both side portions C in the track width direction.

Figure 5:
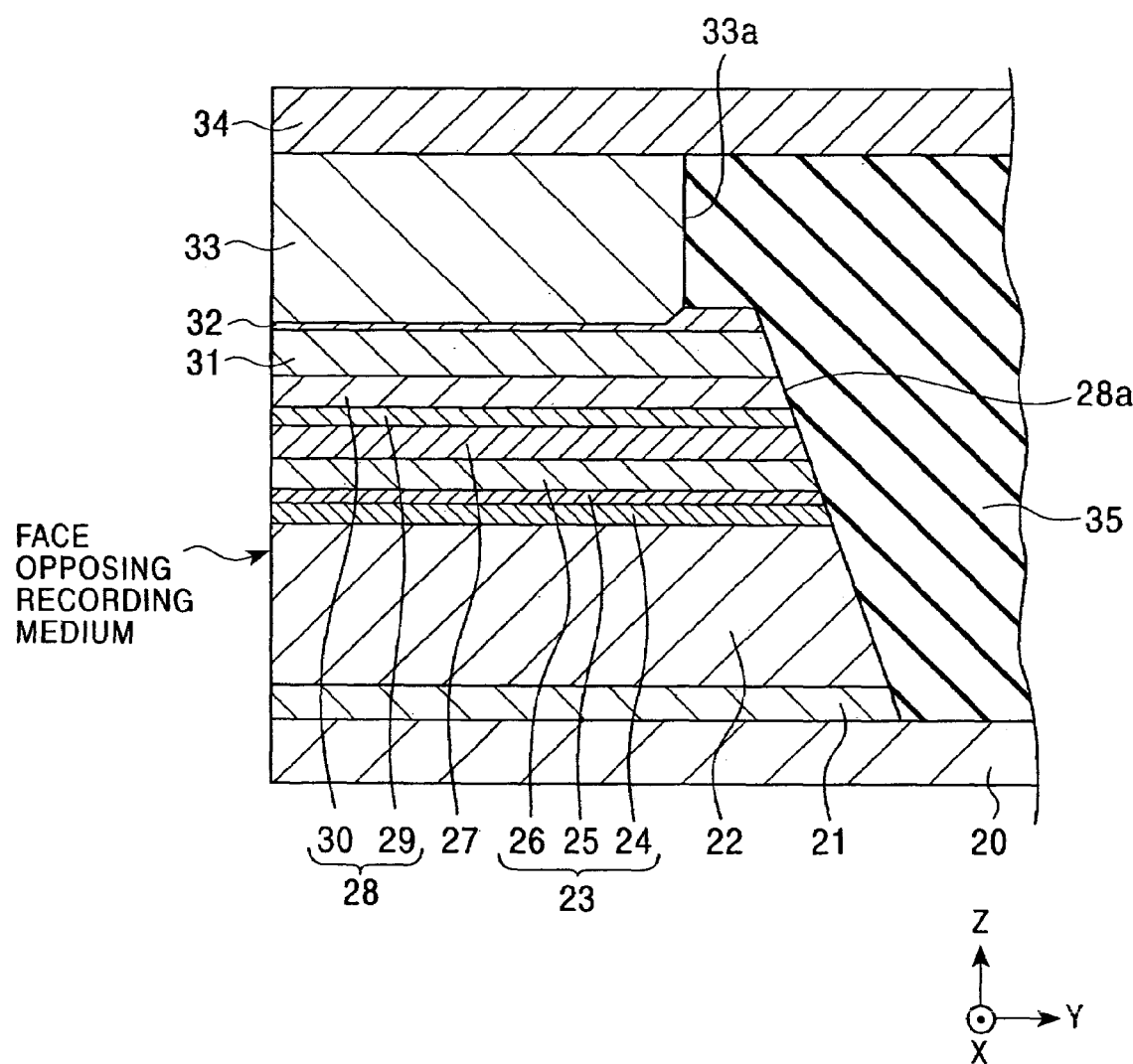
FIG. 5 is a partial, vertical cross-sectional view of the magnetic sensor shown in FIG. 4 taken along the chain line in the direction parallel to the Y-Z plane, the magnetic sensor viewed along the direction indicated by the arrow M.

The second antiferromagnetic layer 33 shown in FIG. 4 is formed, for example, into a shape different from that of the second antiferromagnetic layer 33 shown in FIG. 3. FIG. 5 is a partial, vertical cross-sectional view of the magnetic sensor shown in FIG. 4 taken along the chain line in the direction parallel to the Y-Z plane, the magnetic sensor viewed along the direction indicated by the arrow M.

The magnetic sensor shown in FIG. 5 has the structure in which the side portions C of the free magnetic layer 28 and the third antiferromagnetic layer 31 are formed to extend to the back regions in the height direction (Y direction in the figure) as is the central portion D.

As shown in FIG. 5, the second antiferromagnetic layer 33 is formed only above the side portion C of the third antiferromagnetic layer 31 in the front region, which is formed on the free magnetic layer 28, and unlike that of the second antiferromagnetic layer 33 shown in FIG. 3, the second antiferromagnetic layer 33 is not formed so as to extend over the side portion C of the third antiferromagnetic layer 31 in the back region and the backfill gap layer 35.

As shown in FIG. 5, the back end surface 33a of the second antiferromagnetic layer 33 in the height direction is located at a position closer to the face opposing a recording medium than the back end surface 28a of the free magnetic layer 28 in the height direction, and the backfill gap layer 35 is formed in the height direction (Y direction in the figure) further from the back end surface 33a of the second antiferromagnetic layer 33 in the height direction. In addition, the electrode layer 34 is formed over the second antiferromagnetic layer 33 and the backfill gap layer 35.

Next, the structure of the free magnetic layer 28 of the present invention will be described.

In the magnetic sensors shown in FIGS. 1 to 5, every free magnetic layer 28 has a two-layer structure, and a layer in contact with the nonmagnetic material layer 27 is the diffusion-blocking layer 29 composed, for example, of CoFe or Co. The magnetic material layer 30 is formed of a magnetic material such as a NiFe alloy.

The free magnetic layer 28 may be a single layer formed of a magnetic material. As a magnetic material, a NiFe alloy, a CoFe alloy, a CoFeNi alloy, Co, a CoNi alloy, or the like may be selected. Among those mentioned above, the free magnetic layer 28 is preferably formed of a CoFeNi alloy.

FIG. 6 is a partial, enlarged cross-sectional view primarily showing a part of the free magnetic layer 28. The cross-section is viewed from the face opposing a recording medium.

According to the structure shown in FIG. 6, the free magnetic layer 28 has a three-layer structure. Individual layers, indicated by reference numerals 37a, 37b, and 37c, forming the free magnetic layer 28 are all composed of magnetic materials, and the magnetic material layer 37a is a diffusion-blocking layer for preventing elements from being diffused to and from the nonmagnetic material layer 27. The magnetic material layer 37a is formed of CoFe, Co, or the like.

The magnetic material layer 37c is formed so as to be in contact with the third antiferromagnetic layer 31. The magnetic material layer 37c is preferably formed of a CoFe alloy, and by this structure, an exchange coupling magnetic field generated between the magnetic material layer 37c and the third antiferromagnetic layer 31 can be increased.

As the combination of the materials for forming the three-layer structure shown in FIG. 6, for example, CoFe, NiFe, and CoFe may be used for the magnetic material layer 37a, the magnetic material layer 37b, and the magnetic material layer 37c, respectively.

The thickness of the free magnetic layer 28, formed of only the magnetic materials, is preferably about 30 to 50 Å. In addition, the composition of the CoFe alloy for the free magnetic layer 28 is, for example, 90 atomic percent of Co and 10 atomic percent of Fe.

FIG. 7 is a partial, enlarged cross-sectional view showing another embodiment of the free magnetic layer 28. The free magnetic layer 28 shown in FIG. 7 has a so-called multilayer ferrimagnetic structure. By this structure, without extremely decreasing the physical thickness of the free magnetic layer 28, the effective magnetic thickness thereof can be decreased, and hence the sensitivity to an external magnetic field can be improved.

Reference numerals 39 and 41 indicate magnetic layers, and reference numeral 40 indicates a nonmagnetic interlayer. The magnetic layers 39 and 41 are formed of a magnetic material such as a NiFe alloy, a CoFe alloy, a CoFeNi alloy, Co, or a CoNi alloy. In particular, the magnetic layer 39 and/or the magnetic layer 41 is preferably formed of a CoFeNi alloy. As the composition, it is preferable that the content of Fe be 9 to 17 atomic percent, the content of Ni be 0.5 to 10 atomic percent, and the balance be Co.

Accordingly, an exchange coupling magnetic field by the RKKY interaction effect acting between the magnetic layers 39 and 41 can be increased. In particular, the spin flop magnetic field (Hsf) can be increased to approximately 293 (kA/m) or more. Accordingly, the magnetizations of the magnetic layer 39 and the magnetic layer 41 are appropriately placed in an antiparallel state. In addition, when the composition is within the ranges described above, the magnetostriction of the free magnetic layer 28 can be controlled in the range of from $-3 \times 10^{-6}$ to $3 \times 10^{-6}$, and the coercive force can be decreased to 790 (A/m) or less.

In addition, improvement in soft magnetic characteristics of the free magnetic layer 28 can be appropriately achieved, and in addition, decreases of the change in resistance (ΔR) and rate of the change in resistance (ΔR/R), caused by the diffusion of Ni from or to the nonmagnetic material layer 27, can appropriately be suppressed.

The nonmagnetic interlayer 40 is preferably formed of at least one element selected from the group consisting of Ru, Rh, Ir, Cr, Re, and Cu.

The thicknesses of the magnetic layer 39, the nonmagnetic interlayer 40, and the magnetic layer 41 are, for example, approximately 35, 9, and 15 Å, respectively.

In addition, between the magnetic layer 39 and the nonmagnetic material layer 27, a diffusion-blocking layer formed of a CoFe alloy or Co may be provided. Furthermore, between the magnetic layer 41 and the third antiferromagnetic layer 31, a magnetic layer formed of a CoFe alloy may be provided.

In the case described above, when the magnetic layer 39 and/or the magnetic layer 41 is formed of a CoFeNi alloy, it is preferable that the composition ratio of Fe in the CoFeNi alloy be from 7 to 15 atomic percent, the ratio of the Ni be from 5 to 15 atomic percent, and the balance be Co.

Accordingly, the exchange coupling magnetic field generated between the magnetic layers 39 and 41 by the RKKY interaction effect can be increased. In particular, the spin flop magnetic field (Hsf) can be increased to approximately 293 (kA/m). Hence, the magnetizations of the magnetic layer 39 and the magnetic layer 41 can be appropriately placed in an antiparallel state.

In addition, when the composition is within the ranges described above, the magnetostriction of the free magnetic layer 28 can be controlled in the range of from $-3 \times 10^{-6}$ to $3 \times 10^{-6}$, and the coercive force can be decreased to 790 (A/m) or less. Furthermore, the soft magnetic characteristics of the free magnetic layer 28 can also be improved.

Figure 8:
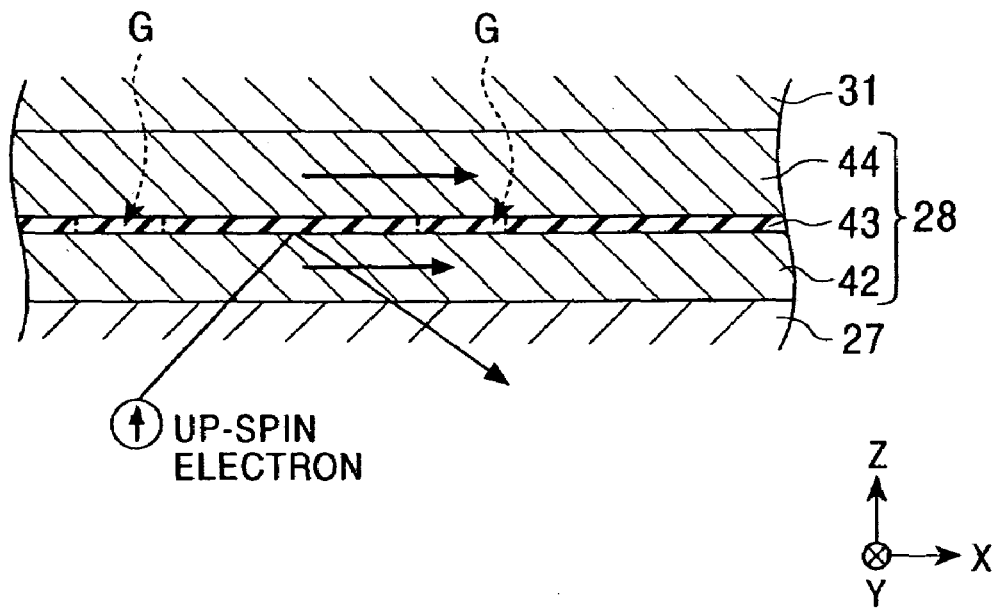
FIG. 8 is a partial, enlarged cross-sectional view of the structure of another free magnetic layer according to the present invention, the free magnetic layer viewed from a face opposing a recording medium.

FIG. 8 is a partial, enlarged cross-sectional view of another embodiment of the free magnetic layer 28 of the present invention. In the free magnetic layer 28 shown in FIG. 8, a specular film 43 is provided between magnetic layers 42 and 44. In the specular film 43, defects (pinholes) G may be formed as shown in FIG. 8. In addition, in the embodiment shown in FIG. 8, the magnetic layers 42 and 44 with the specular film (mirror reflection layer) 43 provided therebetween are magnetized in the same direction (shown by the arrows).

The magnetic layers 42 and 44 are formed of a magnetic material, such as a NiFe alloy, a CoFe alloy, a CoFeNi alloy, Co, or a CoNi alloy.

When the specular film 43 is formed in the free magnetic layer 28, as shown in FIG. 8, a conduction electron (such as an up-spin electron) that reaches the specular film 43 is specularly reflected while maintaining the spin state (energy, quantum state, and the like). The up-spin electron thus specularly reflected changes the traveling direction thereof and can pass through the free magnetic layer.

Accordingly, in the present invention, by providing the specular film 43, a mean free path λ+ of the up-spin electron can be increased as compared to that in the past, the difference between the mean free path λ+ of the up-spin conduction electron and a mean free path λ− of a down-spin conduction electron can be increased thereby, and as a result, the reproduction output can be improved in addition to the improvement of the rate of change in resistance (ΔR/R).

The formation of the specular film 43 is performed, for example, by forming the magnetic layer 42 followed by oxidation of the surface thereof. This oxidized layer may be used as the specular film 43. Subsequently, the magnetic layer 44 is formed on the specular film 43.

As a material for the specular film 43, for example, there may be mentioned an oxide, such as Fe—O, Ni—O, Co—O, Co—Fe—O, Co—Fe—Ni—O, Al—O, Al—Q—O (where Q is at least one element selected from the group consisting of boron (B), silicon (Si), nitrogen (N), titanium (Ti), vanadium (V), Cr, manganese (Mn), Fe, Co, and Ni), or R—O (where R is at least one element selected from the group consisting of Cu, Ti, V, Cr, zirconium (Zr), niobium (Nb), molybdenum (Mo), hafnium (Hf), Ta, and W); a nitride such as Al—N, Al—Q—N (where Q is at least one element selected from the group consisting of B, Si, oxygen (O), Ti, V, Cr, Mn, Fe, Co, and Ni), or R—N (where R is at least one element selected from the group consisting of Ti, V, Cr, Zr, Nb, Mo, Hf, Ta, and W); or a half-metal whistler alloy.

Figure 9:
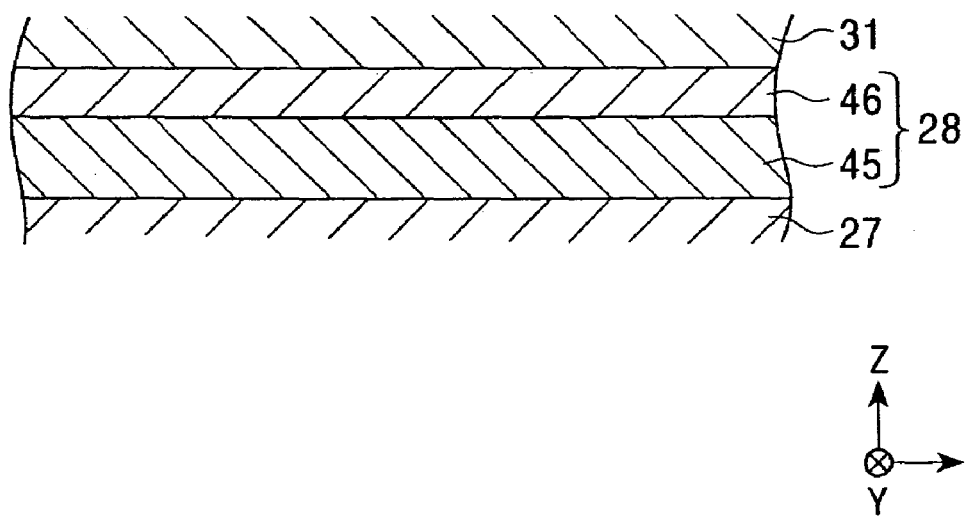
FIG. 9 is a partial, enlarged cross-sectional view of the structure of another free magnetic layer according to the present invention, the free magnetic layer viewed from a face opposing a recording medium.

FIG. 9 is a partial, enlarged cross-sectional view of another embodiment of the free magnetic layer 28 of the present invention.

The free magnetic layer 28 shown in FIG. 9 is composed of a magnetic layer 45 and a back layer 46. The back layer 46 is formed, for example, of Cu, Au, Cr, or Ru. The magnetic layer 45 is formed of a magnetic material such as a NiFe alloy, a CoFe alloy, a CoFeNi alloy, Co, or a CoNi alloy.

By providing the back layer 46, the mean free path of an up-spin conduction electron, which contributes to the magnetoresistive effect, is increased, and a high rate of change in resistance can be obtained in a spin-valve type magnetic sensor by a so-called spin filter effect, thereby achieving the higher recording density. In addition, since the back layer 46 allows an exchange coupling magnetic field to pass therethrough, the exchange coupling magnetic field between the third antiferromagnetic layer 31 and the magnetic layer 45 can be maintained at a satisfactory level although decreased to some extent.

The magnetic sensors shown in FIGS. 1 to 5 are each a so-called current-in-plane (CIP) type magnetic sensor in which the electrode layers 34 are provided above the side portions C of the multilayer film, formed of the substrate 20 to the nonmagnetic layer 32, with the second antiferromagnetic layers 33 provided therebetween, and in which current flowing through the multilayer film is in the direction parallel to the film surfaces of the individual layers of the multilayer film.

In addition to the CIP type magnetic sensor, the present invention may be applied to a so-called current-perpendicular-to-plane (CPP) type magnetic sensor in which electrode layers are formed at the upper and the lower sides of the multilayer film, and in which current flowing through the multilayer film between the electrode layers is in the direction perpendicular to the surfaces of the individual layers of the multilayer film.

However, in the case described above, at positions at which the electrode layers 34 shown in FIGS. 1 to 5 are to be formed, insulating layers composed of $Al_2O_3$, $SiO_2$, or the like are formed. In addition, these insulating layers or insulating layers formed in a step different from that for the insulating layers described above are preferably formed to extend along the inside end surfaces 33c of the second antiferromagnetic layers 33. In addition, the substrate 20 is formed of a lower shield layer, which comprises a magnetic material and also functions as a lower electrode. Furthermore, an upper shield layer composed of a magnetic material, which also functions as an upper electrode, is formed over the insulating layers and the area between the second antiferromagnetic layers 33 having the length L in the track width direction (X direction in the figure).

In addition, whenever necessary, a nonmagnetic layer (not shown) may be provided at least in the area having the length L. The nonmagnetic layer is preferably formed of a nonmagnetic conductive material such as Ta; Ru, Rh, Ir, Cr, Re, or Cu. The nonmagnetic layer described above serves as an upper gap layer.

In addition, in the CPP type magnetic sensor described above, the nonmagnetic material layer 27 forming the magnetic sensor may be formed of a nonmagnetic conductive material such as Cu or may be formed of an insulating material such as $Al_2O_3$ or $SiO_2$. The former magnetic sensor has the structure called a spin-valve GMR magnetoresistive element (CPP-GMR) and the latter magnetic sensor has the structure called a spin-valve tunnel effect magnetoresistive element (CPP-TMR).

The tunnel effect magnetoresistive element generates the change in resistance by using a spin tunnel effect, when the magnetization of the fixed magnetic layer 23 and that of the free magnetic layer 28 are antiparallel to each other, a tunnel current is most unlikely to flow through the nonmagnetic material layer 27, and hence the resistance becomes the maximum value. On the other hand, when the magnetization of the fixed magnetic layer 23 and that of the free magnetic layer 28 are parallel to each other, a tunnel current is most likely to flow through the nonmagnetic material layer 27, and hence the resistance becomes the minimum value.

By the use of this principle, when the magnetization of the free magnetic layer 28 varies by influence of an external magnetic field, this variation in electrical resistance is grasped as the change in voltage (during constant current operation) or as the change in current (during constant voltage operation), and consequently a leak magnetic field from a recording medium can be detected.

FIGS. 10 to 19 show steps of a manufacturing method of the magnetic sensor shown in FIG. 1.

Figure 10:
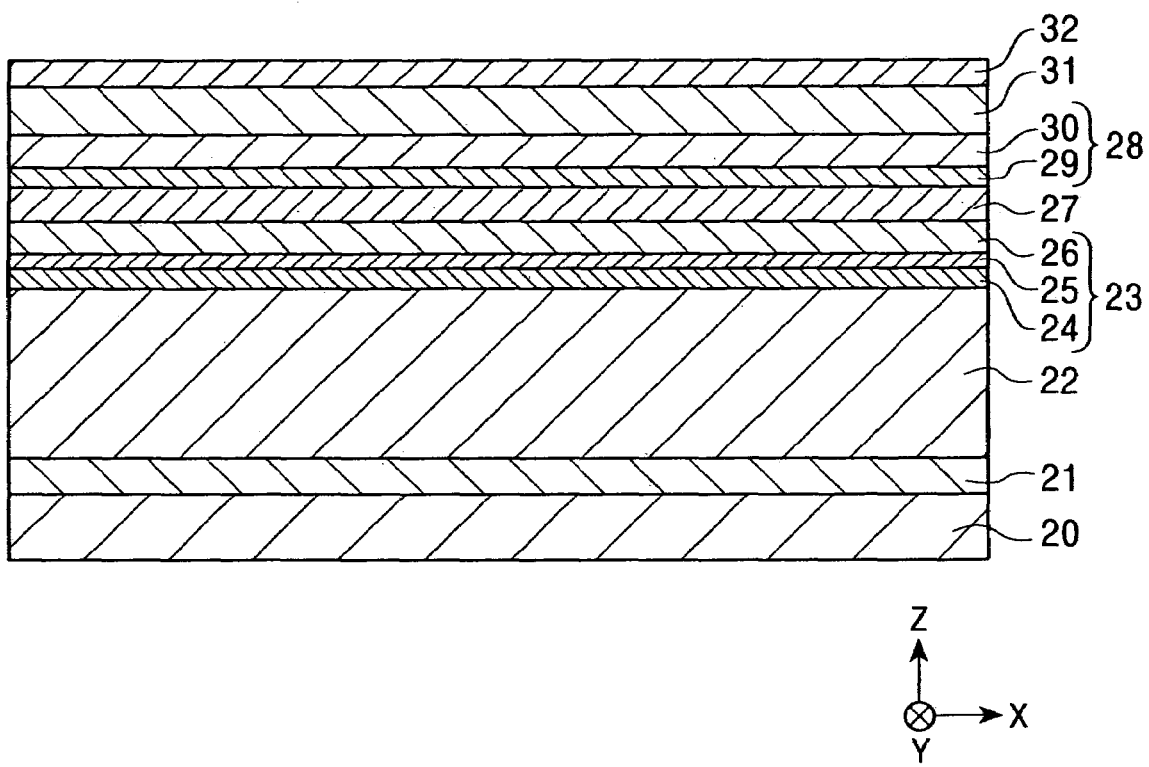
FIG. 10 is a view showing a step of manufacturing the magnetic sensor shown in FIG. 1, the view being a partial cross-sectional view of the magnetic sensor, which is viewed from a face opposing a recording media.

FIG. 10 is a partial cross-sectional view showing the magnetic sensor in a manufacturing step, which is viewed from the face opposing a recording media.

In the step shown in FIG. 10, on the substrate 20 is continuously formed the seed layer 21, the first antiferromagnetic layer 22, the fixed magnetic layer 23, the nonmagnetic material layer 27, the free magnetic layer 28, the third antiferromagnetic layer 31, and the nonmagnetic layer 32. The film formation is performed by sputtering, deposition, or the like. As the sputtering mentioned above, for example, there may be mentioned DC magnetron sputtering, RF sputtering, ion beam sputtering, long-throw sputtering, or collimation sputtering.

The fixed magnetic layer 23 shown in FIG. 10 has a multilayer ferrimagnetic structure composed of the magnetic layers 24 and 26, which are formed of a CoFe alloy or the like, and the nonmagnetic interlayer 25 which is provided therebetween and is formed of Ru or the like. The free magnetic layer 28 has a multilayer structure composed of the diffusion-blocking layer 29 formed of a CoFe alloy or the like and the magnetic material layer 30 formed of a NiFe alloy or the like.

In the present invention, the first antiferromagnetic layer 22 and the third antiferromagnetic layer 31 are preferably formed of a PtMn alloy, an X—Mn alloy (where X is at least one element selected from the group consisting of Pd, Ir, Rh, Ru, Os, Ni, and Fe), or a Pt—Mn—X' alloy (where X' is at least one element selected from the group consisting of Pd, Ir, Rh, Ru, Au, Ag, Os, Cr, Ni, Ar, Ne, Xe, and Kr).

In addition, in the alloys represented by the PtMn and the X—Mn, the Pt or X is preferably in the range of from 37 to 63 atomic percent. In the alloys represented by the PtMn and the X—Mn, the Pt or X is more preferably in the range of from 47 to 57 atomic percent.

In the alloy represented by Pt—Mn—X', the X'+Pt is preferably in the range of from 37 to 63 atomic percent. In the alloy represented by Pt—Mn—X' alloy, the X'+Pt is more preferably in the range of from 47 to 57 atomic percent. Furthermore, in the alloy represented by Pt—Mn—X', the X' is preferably in the range of from 0.2 to 10 atomic percent. However, when the X' is at least one element selected from the group consisting of Pd, Ir, Rh, Ru, Os, Ni, and Fe, the X' is preferably in the range of from 0.2 to 40 atomic percent.

In addition, in the present invention, the thickness of the first antiferromagnetic layer 22 is preferably set to the range of from 80 to 300 Å. By forming the first antiferromagnetic layer 22 having a large thickness as described above, a large exchange coupling magnetic field can be generated between the first antiferromagnetic layer 22 and the fixed magnetic layer 23 by annealing in a magnetic field. In particular, an exchange coupling magnetic field of 48 kA/m or more, such as more than 64 kA/m, can be generated.

In the present invention, the thickness of the third antiferromagnetic layer 31 is preferably in the range of from 20 to 50 Å, and more preferably in the range of from 30 to 40 Å.

Since having a small thickness of 50 Å or less as described above, the third antiferromagnetic layer 31 tends to have non-antiferromagnetic characteristics. Accordingly, even when the following first annealing in a magnetic field is performed, ordered transformation of the third antiferromagnetic layer 31 is unlikely to occur, the exchange coupling magnetic field is not generated between the third antiferromagnetic layer 31 and the free magnetic layer 28 or is very small even thought generated, and as a result, unlike the fixed magnetic layer 23, the magnetization of the free magnetic layer 28 is not tightly fixed.

The reason the thickness of the third antiferromagnetic layer 31 is set to 20 Å or more and preferably set to 30 Å or more is that when the thickness thereof is smaller than that described above, although the second antiferromagnetic layer 33 is formed above each of the side portions C of the third antiferromagnetic layer 31 in the front region in a subsequent step, the side portions C of the third antiferromagnetic layer 31 in the front region are unlikely to have antiferromagnetic characteristics, and as a result, an exchange coupling magnetic field having an appropriate magnitude is not generated between each side portion C of the third antiferromagnetic layer 31 in the front region and that of the free magnetic layer 28.

In addition, as in the step shown in FIG. 10, when the nonmagnetic layer 32 is formed on the third antiferromagnetic layer 31, even when the multilayer film shown in FIG. 10 is exposed to the air, the third antiferromagnetic layer 31 is appropriately prevented from being oxidized.

The nonmagnetic layer 32 described above must be a dense layer that is unlikely to be oxidized although being exposed to the air. In addition, even when elements forming the nonmagnetic layer 32 penetrate into the third antiferromagnetic layer 31 by thermal diffusion or the like, the elements must have properties that will not degrade the properties used as the antiferromagnetic film.

In the present invention, the nonmagnetic layer 32 is preferably formed of Cr or at least one noble metal selected from the group consisting of Ru, Re, Pd, Os, Ir, Pt, Au, and Rh.

The nonmagnetic layer 32 formed of a noble metal such as Ru is a dense layer which is unlikely to be oxidized even when being exposed to the air. Hence, even when the thickness of the nonmagnetic layer 32 is decreased, the third antiferromagnetic layer 31 is appropriately prevented from being oxidized when exposed to the air.

In the present invention, the nonmagnetic layer 32 is preferably formed to have a thickness of 3 to 10 Å. Even when the nonmagnetic layer 32 has a small thickness as described above, the third antiferromagnetic layer 31 can be appropriately prevented from being oxidized when exposed to the air. By forming the nonmagnetic layer 32 having a small thickness as described above, ion milling in a step shown in FIG. 15 can be performed at low energy, and the control of milling can be improved as compared to that in the past. The above feature will be particularly described in the step shown in FIG. 15.

As shown in FIG. 10, after the individual layers including the nonmagnetic layer 32 are formed on the substrate 20, the first annealing in a magnetic field is performed. While a first magnetic field (Y direction in the figure) is applied in the direction perpendicular to the track width Tw (X direction in the figure), heat treatment at a first heat treatment temperature is performed so that the exchange coupling magnetic field is generated between the first antiferromagnetic layer 22 and the magnetic layer 24 forming the fixed magnetic layer 23, and as a result, the magnetization of the magnetic layer 24 is fixed in the Y direction in the figure. The magnetization of the other magnetic layer 26 is fixed in the direction opposite to the Y direction shown in the figure by exchange coupling because of the RKKY interaction effect acting between the magnetic layer 26 and the magnetic layer 24. In this case, for example, the first heat treatment temperature is set to 270° C., and the magnitude of the magnetic field is set to 800 kA/m.

In addition, as described above, by this first annealing in a magnetic field, the exchange coupling magnetic field is not generated between the third antiferromagnetic layer 31 and the magnetic material layer 30 forming the free magnetic layer 28 or may be very small even thought being generated. The reason for this is that since having a small film thickness of 50 Å or less, the third antiferromagnetic layer 31 does not have antiferromagnetic characteristics.

It has been believed that when the first annealing in a magnetic field is performed, the noble metal such as Ru forming the nonmagnetic layer 32 is diffused inside the third antiferromagnetic layer 31. Accordingly, the constituent elements of the third antiferromagnetic layer 31 which are present in the vicinity of the surface thereof after the annealing are primarily the noble metal and elements forming the antiferromagnetic layer. It has also been believed that the noble metal element that is diffused inside the third antiferromagnetic layer 31 has a higher concentration at the side of the top surface thereof than that at the bottom surface, and that the composition ratio of the noble metal thus diffused gradually decreases from the side of the top surface of the third antiferromagnetic layer 31 to that of the bottom surface thereof. The change in composition described above can be confirmed by EDX analysis using a SIMS analyzer or a TEM.

Figure 11:
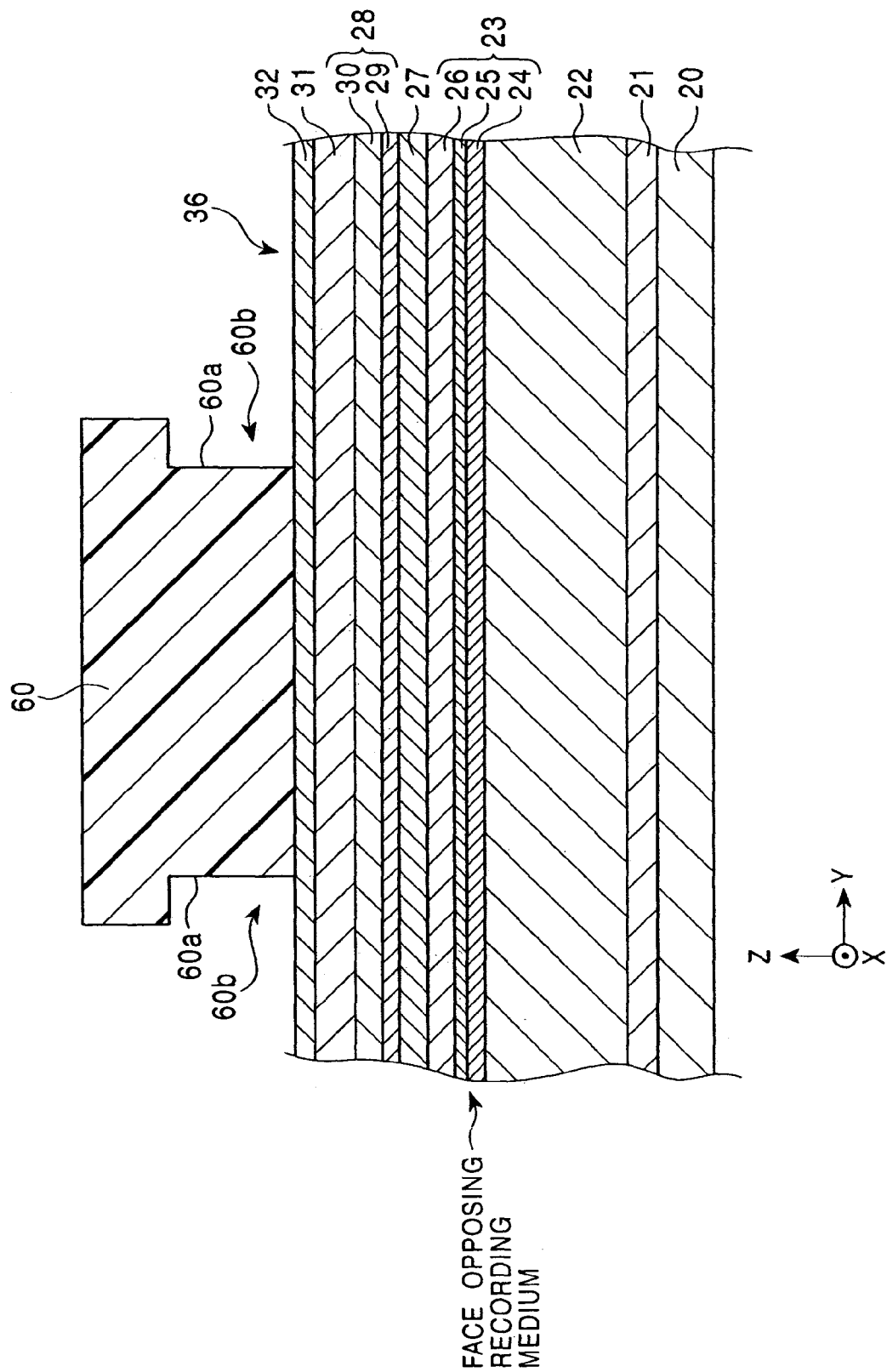
FIG. 11 is a view showing a step following the step shown in FIG. 10 and is a partial, vertical cross-sectional view of a magnetic sensor shown in FIG. 12, which is taken along a chain line in the direction parallel to a Y-Z plane and is viewed along a direction indicated by an arrow N.
Figure 12:
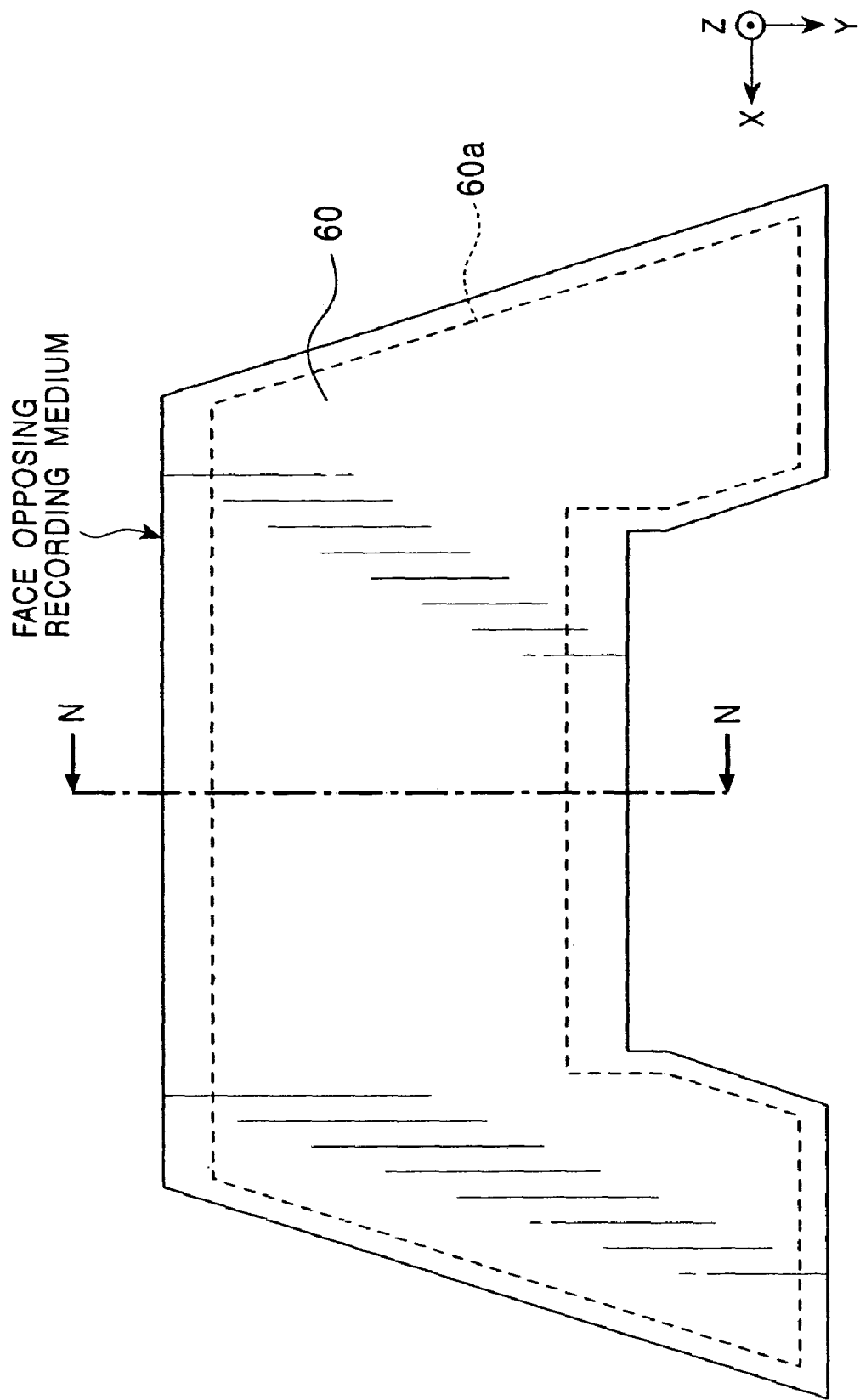
FIG. 12 is a view of the step shown in FIG. 11, which is viewed from directly overhead.

Next, a step shown in FIG. 11 is performed. FIG. 12 is a partial plan view showing the magnetic sensor in a manufacturing step, which is viewed from directly overhead. FIG. 11 is a vertical cross-sectional view of the magnetic sensor, which is taken along the chain line shown in FIG. 12 in the direction parallel to the Y-Z plane and is viewed along the direction indicated by the arrow N. The magnetic sensor shown in FIG. 12 is reduced as compared to that shown in FIG. 11.

As can be seen from the steps shown FIGS. 11 and 12, after the step shown in FIG. 10, a lift-off resist layer 60 is formed on the nonmagnetic layer 32. When viewed from directly overhead, the resist layer 60 has, for example, a shape as shown in FIG. 12, and the dotted line 60a in the resist layer 60 shown in FIG. 12 indicates a side surface 60a of a cut portion 60b formed in the lower side of the resist layer 60 (see FIG. 11).

This resist layer 60 is provided to form the multilayer film 36, which is composed of the seed layer 21 to the nonmagnetic layer 32, into a predetermined shape, and in particular, is provided to form the back end surface 36a of the multilayer film 36 in the height direction into a predetermined shape. In a step shown in FIG. 13, part of the multilayer film 36, which is not covered with the resist layer 60, is removed by ion milling.

Figure 13:
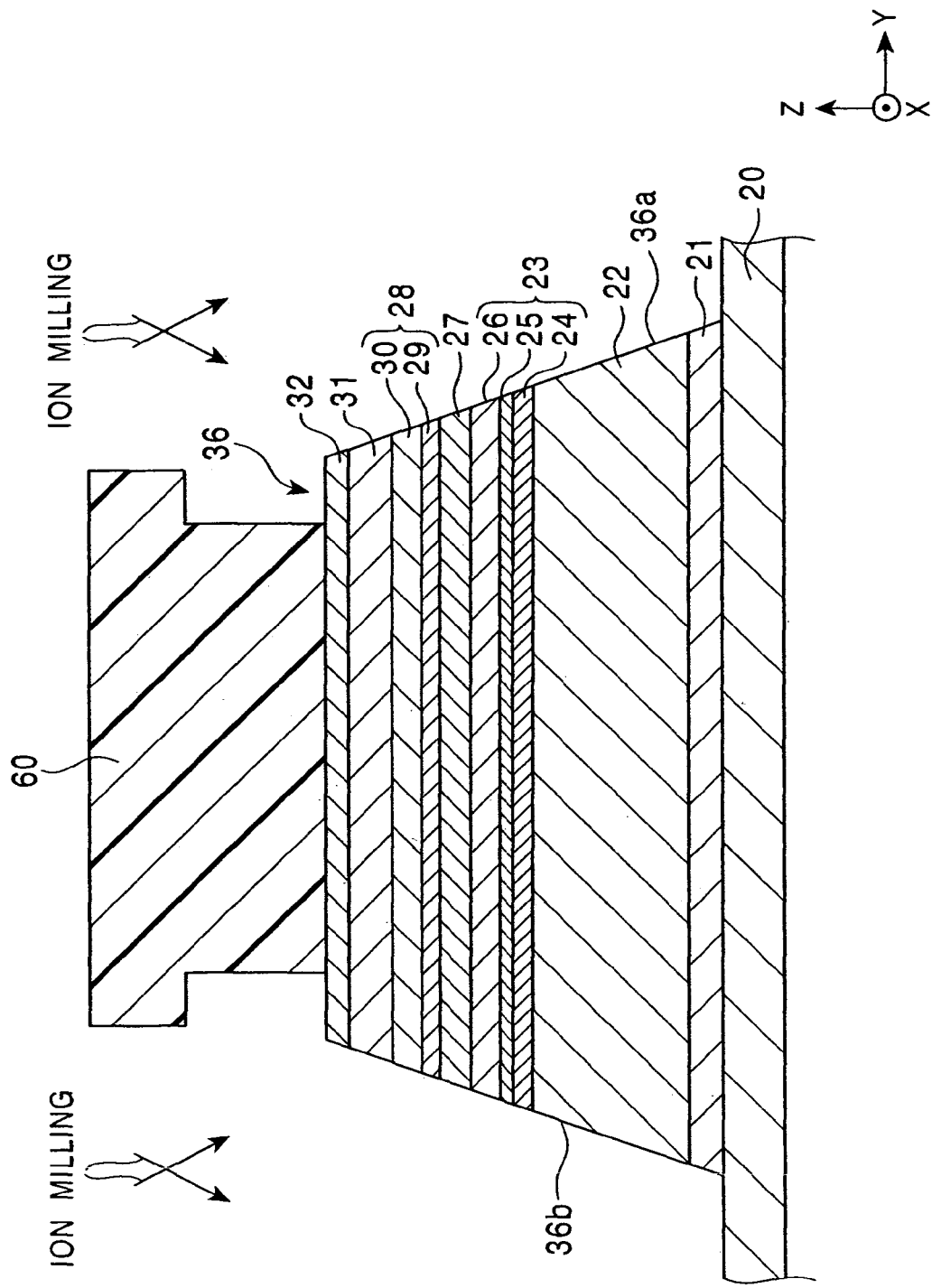
FIG. 13 is a view showing a step following the step shown in FIG. 11 and is a partial, vertical cross-sectional view of the magnetic sensor in a manufacturing step.

FIG. 13 is a vertical cross-sectional view of the magnetic sensor in a manufacturing step, which is viewed from the same cross-section as that shown in FIG. 11, and the part of the multilayer film 36 formed of the seed layer 21 to the nonmagnetic layer 32, which is not covered with the resist layer 60, is removed by ion milling. A milling angle in this ion milling is preferably perpendicular to the surface of the substrate 20 or is preferably close to that mentioned above. As shown in FIG. 13, by this ion milling, the back end surface 36a in the height direction and a front end surface 36b close to the face opposing a recording medium are formed into inclined surfaces or curved surfaces so that the distance therebetween in the height direction (Y direction in the figure) is gradually decreased from the bottom to the top side (to the Z direction in the figure). The plan shape of the multilayer film 36 is approximately equivalent to that of the resist layer 60 shown in FIG. 12.

Figure 14:
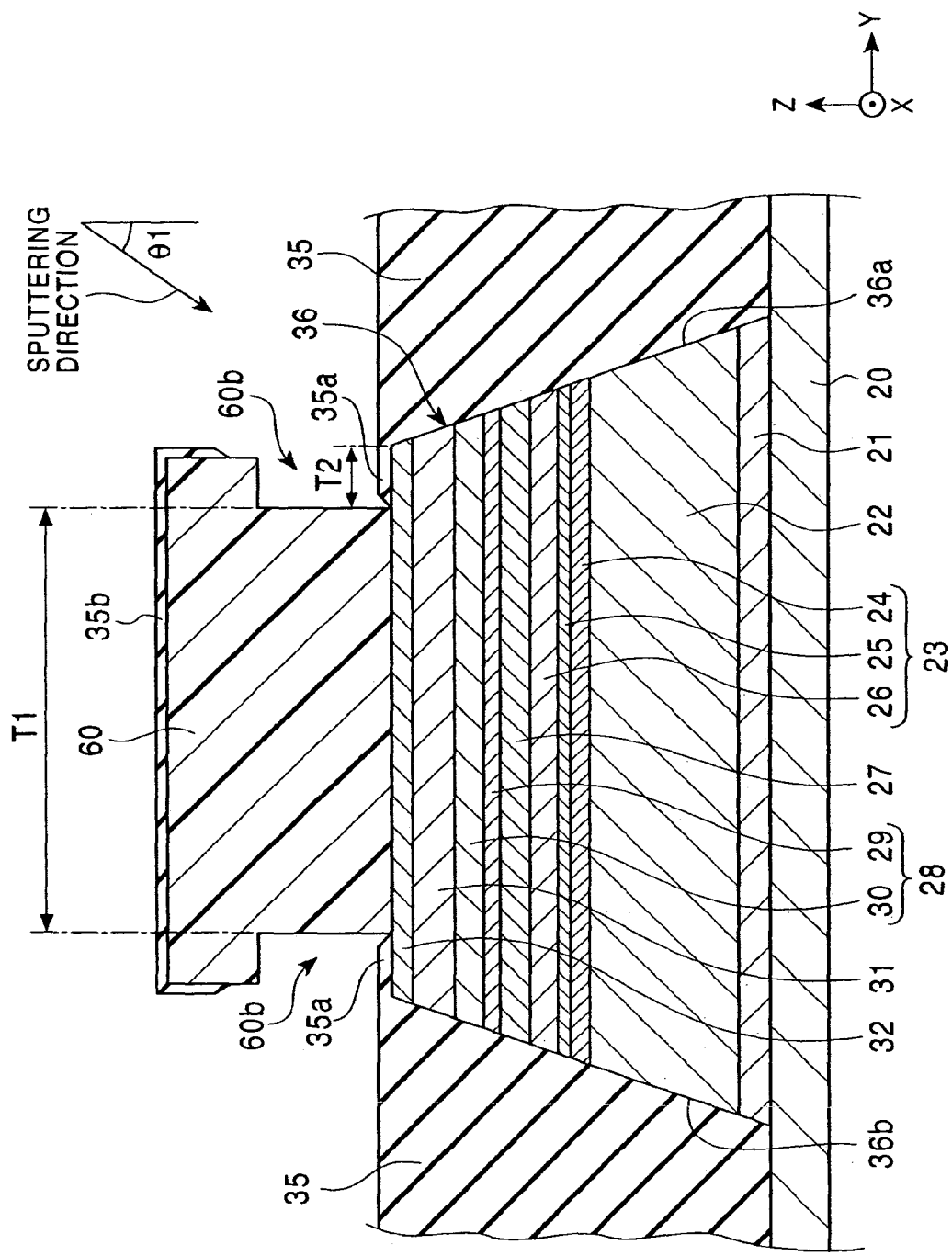
FIG. 14 is a view showing a step following the step shown in FIG. 13 and is a partial, vertical cross-sectional view of the magnetic sensor in a manufacturing step.

Next, in a step shown in FIG. 14 (partial, vertical cross-sectional view of the magnetic sensor in a manufacturing step), the backfill gap layer (insulating layer) 35 is formed around the multilayer film 36 by sputtering. From the vertical cross-sectional view shown in FIG. 14, it is understood that a part of the backfill gap layer 35 is formed in a region in the height direction (Y direction in the figure) further from the back end surface 36a of the multilayer film 36 in the height direction, and another part of the backfill gap layer 35 is formed in a region in the direction toward the face opposing a recording medium (direction opposite to the Y direction in the figure) further from the front end surface 36b of multilayer film 36.

In addition, in this step, by appropriately adjusting a sputtering angle when the backfill gap layer 35 is formed, the backfill gap layer 35 is formed at the cut portion 60b formed in the resist layer 60 so that the end portion 35a of the backfill gap layer 35 is formed on the multilayer film 36.

In this step, a sputtering angle θ1 in forming the backfill gap layer 35 is preferably set to 30 to 70° inclined from the direction perpendicular to the surface of the substrate 20. By this sputtering angle, the end portion 35a of the backfill gap layer 35 is appropriately formed on the multilayer film 36. In addition to the above sputtering angle in forming the backfill gap layer 35, by appropriately adjusting a length T1 (see FIG. 14) of the bottom surface of the resist layer 60 in the height direction in the step shown in FIG. 12, a length T2 of the end portion 35a of the backfill gap layer 35 provided on the multilayer film 36 can be controlled in a predetermined range. In addition, when the "face opposing a recording medium" is defined at a final step shown in FIG. 19, the length T2 is adjusted so as to be approximately 20% to 30% of the length of the free magnetic layer 28 from the face opposing a recording medium to the back end surface 28a in the height direction.

In addition, in this step, an insulating material layer 35b composed of the same material as that for the backfill gap layer 35 is adhered to the resist layer 60.

Figure 15:
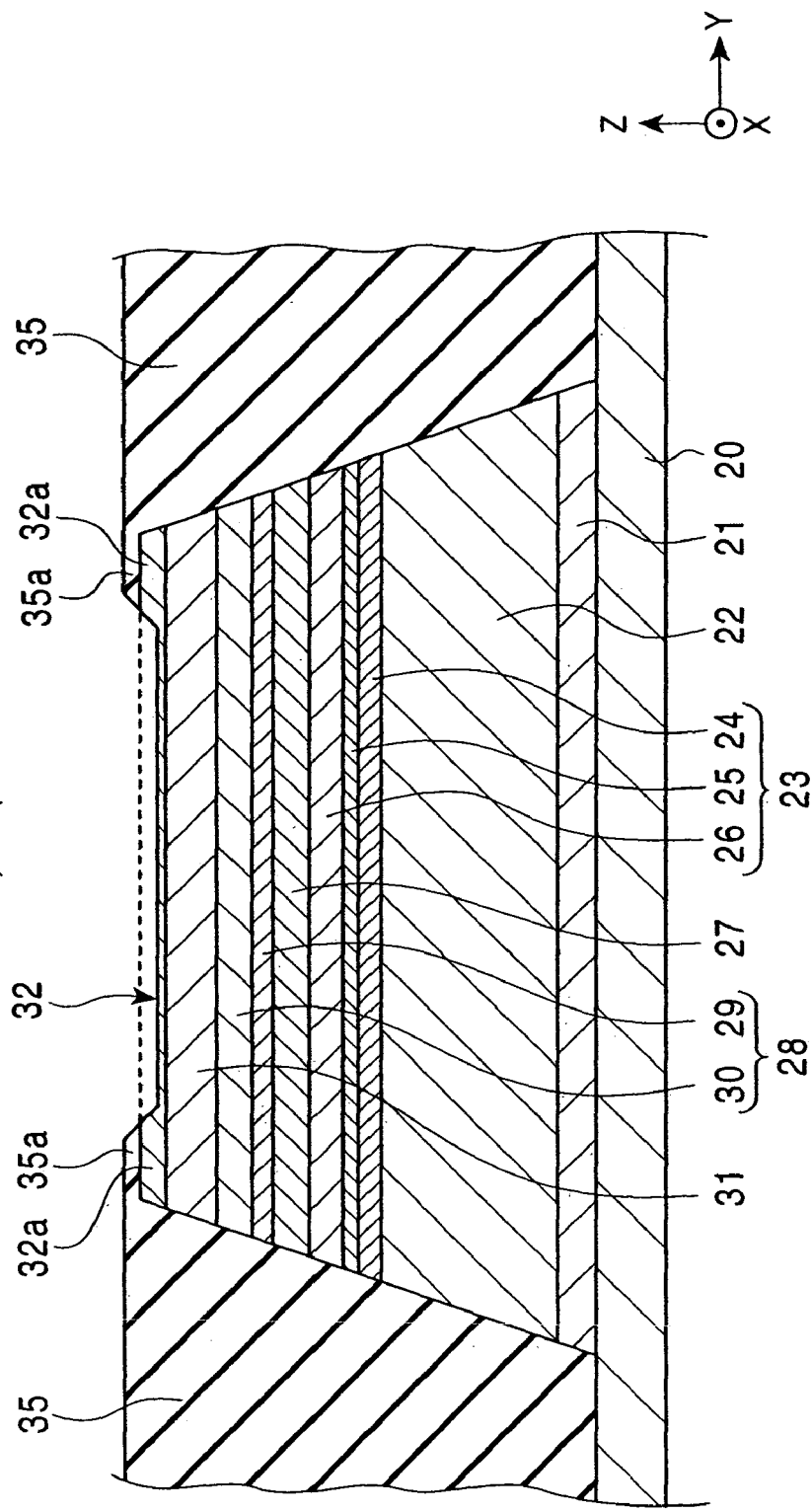
FIG. 15 is a view showing a step following the step shown in FIG. 14 and is a partial, vertical cross-sectional view of the magnetic sensor in a manufacturing step.

Next, in the step shown in FIG. 15 (partial, vertical cross-sectional view of the magnetic sensor in a manufacturing step), the resist layer 60 in the step shown in FIG. 14 is removed, and an exposed part of the nonmagnetic layer 32 defined by the end portion 35a of the backfill gap layer 35 is removed by ion milling.

In the ion milling step shown in FIG. 15, low-energy ion milling can be used. The reason for this is that the nonmagnetic layer 32 has a very small thickness of approximately 3 to 10 Å. In the present invention, even when the nonmagnetic layer 32 formed of Ru or the like has a very small thickness of approximately 3 to 10 Å the third antiferromagnetic layer 31 can be sufficiently prevented from being oxidized, and the control of milling can be easily performed by low-energy ion milling so that the milling may be stopped after the nonmagnetic layer 32 is partly ground.

As described above, in the present invention, low-energy ion milling can be used, and hence the control of milling can be improved as compared to that in the past. The low-energy ion milling is defined as ion milling using ion beams having a beam voltage (acceleration voltage) of less than 1,000 V. For example, 100 to 500 V is used as the beam voltage. In this embodiment, argon (Ar) ion beam system having a low beam voltage of 200 V is used.

In the step shown in FIG. 15, the part of the nonmagnetic layer 32 defined by the end portion 35a of the backfill gap layer 35 is ground by the ion milling, and as shown in FIG. 15, the part of the nonmagnetic layer 32 described above remains so as to have a very small thickness. The part of the nonmagnetic layer 32 may be entirely removed; however, when the part of the nonmagnetic layer 32 defined by the end portion 35a remains, the thickness of the part of the nonmagnetic layer 32 is preferably 3 Å or less.

The reason for this is that, when the second antiferromagnetic layers 33 are formed in a subsequent step on the part of the nonmagnetic layer 32 defined by the end portion 35a, and when the thickness of the part of the nonmagnetic layer 32 is large, the third antiferromagnetic layer 31 provided thereunder and each of the second antiferromagnetic layers 33 will not function as an integrated antiferromagnetic layer, and as a result, the magnetization of the free magnetic layer 28 cannot be appropriately controlled.

In addition, as shown in FIG. 15, since the end portion 32a of the nonmagnetic layer 32 provided under the end portion 35a of the backfill gap layer 35 is not influenced by the ion milling, the end portion 32a of the nonmagnetic layer 32 has an original thickness which is obtained in the film forming step. Accordingly, after the step shown in FIG. 15, the end portion 32a of the nonmagnetic layer 32 remains so as to have a thickness larger than that of the part thereof defined by the end portion 35a of the backfill gap layer 35.

Figure 16:
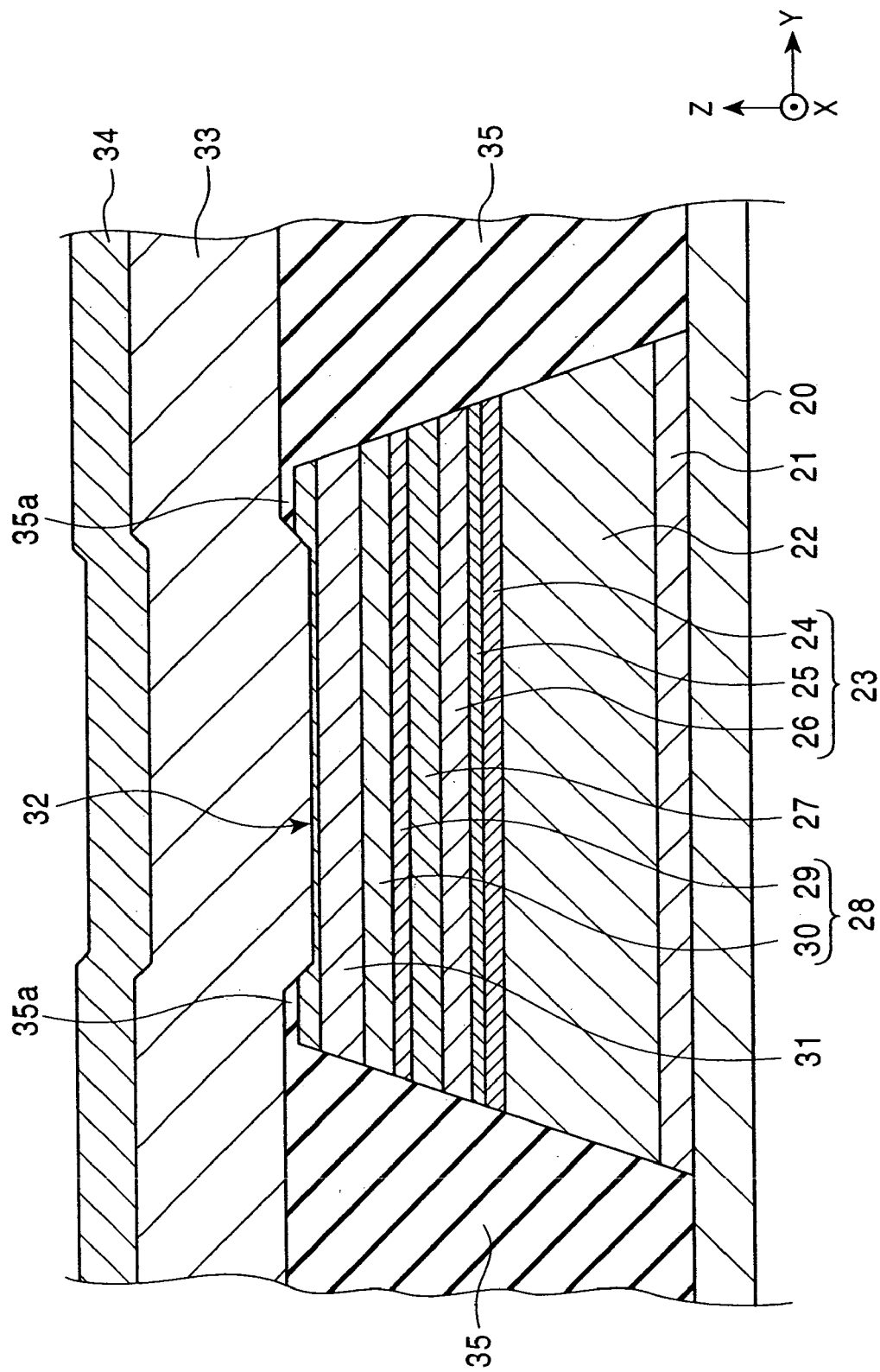
FIG. 16 is a view showing a step following the step shown in FIG. 15 and is a partial, vertical cross-sectional view of the magnetic sensor in a manufacturing step.

In a step shown in FIG. 16 (partial, vertical cross-sectional view of the magnetic sensor in film formation), over the exposed nonmagnetic layer 32, which is not covered with the backfill gap layer 35, and the entire backfill gap layer 35, a solid second antiferromagnetic layer 33 and a solid electrode layer 34 are sequentially formed by sputtering while the evacuated state is continuously maintained.

As is the third antiferromagnetic layer 31, the solid second antiferromagnetic layer 33 is preferably formed of a PtMn alloy, an X—Mn alloy (where X is at least one element selected from the group consisting of Pd, Ir, Rh, Ru, Os, Ni, and Fe), or a Pt—Mn—X' alloy (where X' is at least one element selected from the group consisting of Pd, Ir, Rh, Ru, Au, Ag, Os, Cr, Ni, Ar, Ne, Xe, and Kr). In addition, the solid electrode layer 34 is formed for example, of Au, W, Cr, Ru, Rh, or Ta.

Figure 17:
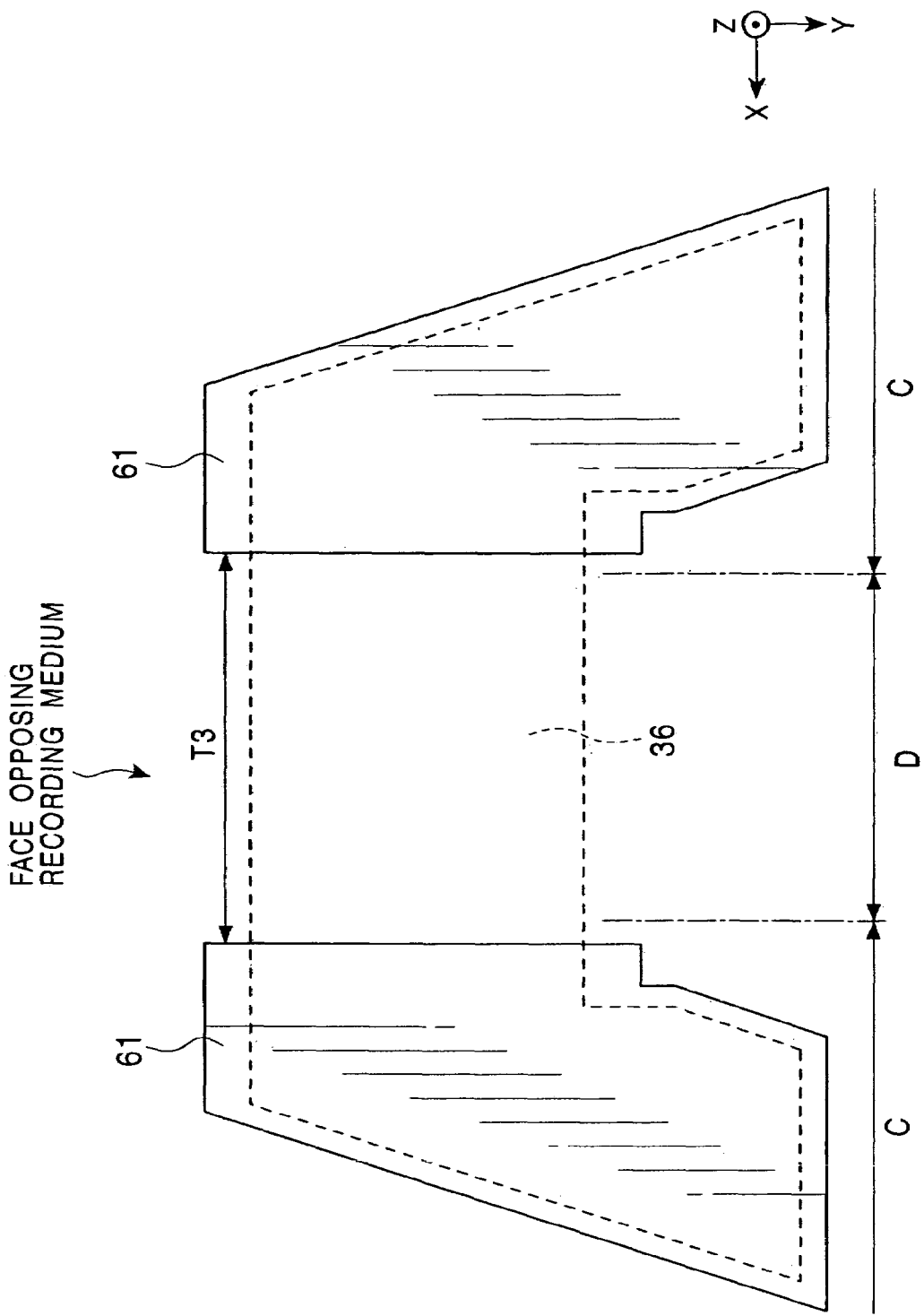
FIG. 17 is a view showing a step following the step shown in FIG. 16 and is a partial plan view of the magnetic sensor in a manufacturing step, which is viewed from directly overhead.

FIG. 17 is a partial plan view showing the magnetic sensor in a manufacturing step, which is viewed from directly overhead. The magnetic sensor shown in FIG. 17 is reduced as compared to that shown in FIG. 16. In a step shown in FIG. 17, mask layers 61 having shapes shown in FIG. 17 are formed on the solid electrode layer 34 shown in FIG. 16. The mask layers 61 are provided on approximately the same positions as plane areas on which the two side portions C of the third antiferromagnetic layer 31 are to be formed. Each of the mask layers 61 may be formed of a resist or may be a metal or an insulating layer. For example, when the mask layers 61 are each formed of a metal layer or an insulating layer, after resist layers are formed by exposure and development in regions other than that in which the mask layers 61 are to be formed, metal layers or insulating layers are formed by sputtering in the regions in which the mask layers 61 are to be formed, followed by removing the resist layers. When formed of metal layers, for example, the mask layers 61 are each formed of Ta, Cr, Ti, Si, Zr, Nb, Mo, Hf, or W. In addition, the mask layers 61 are preferably metal layers. The reason for this is that the mask layers 61 can be used as parts of electrodes after etching performed in the following step.

Since a distance T3 shown in FIG. 17 between the mask layers 61 in the track width direction (X direction in the figure) is slightly larger than the width defining the track width Tw, the distance T3 is preferably decreased as small as possible. In this step, the distance T3 is preferably formed to be 0.1 to 0.3 µm.

A region surrounded by the dotted line shown in FIG. 17 indicates a region in which the multilayer film 36 including the seed layer 21 to the nonmagnetic layer 32 is formed. In the region in which the mask layers 61 and the multilayer film 36 overlap each other, the plane shape of the mask layer 61 is formed slightly larger than that of the multilayer film 36, as shown in the figure. The reason for this is that the two side portions C of the multilayer film 36 are reliably covered with the second antiferromagnetic layers 33 so that the magnetization control of the free magnetic layer 28 is appropriately performed.

Figure 18:
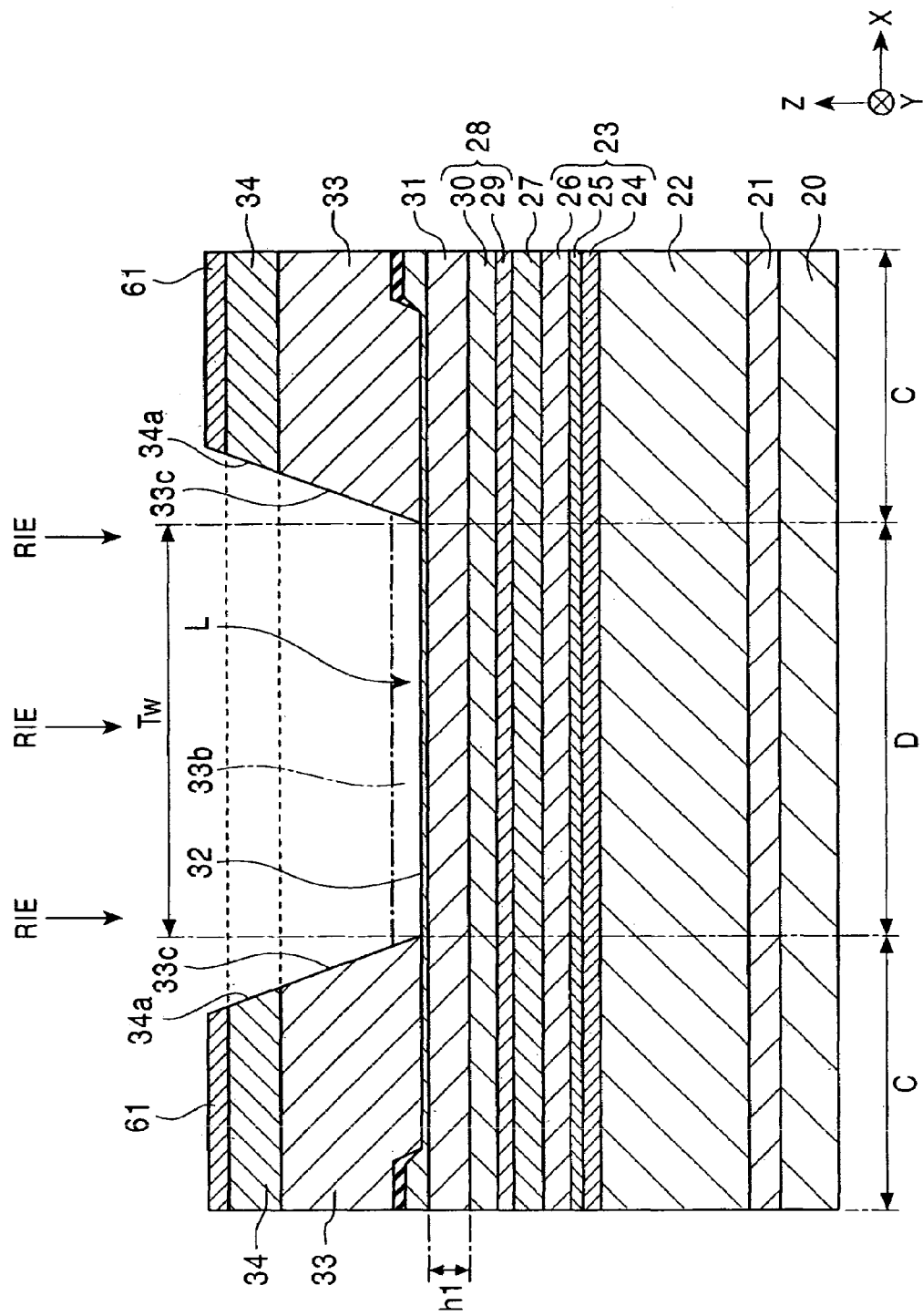
FIG. 18 is a view showing a step following the step shown in FIG. 17 and is a partial cross-sectional view of the magnetic sensor in a manufacturing step, which is viewed from the face opposing a recording medium.

In a step shown in FIG. 18 (partial cross-sectional view of the magnetic sensor in a manufacturing step, which is viewed from the face opposing a recording medium), a part of the solid electrode layer 34 and a part of the solid second antiferromagnetic layer 33, which are not covered with the mask layers 61, are removed by ion milling or reactive ion etching (RIE) (the parts of the solid electrode layer 34 and the solid second antiferromagnetic layer 33 indicated by the dotted lines are removed). The etching direction in this step is preferably perpendicular to the surface of the substrate 20 or is preferably close thereto.

As shown in the cross-sectional view of FIG. 18, in which the magnetic sensor is viewed from the face opposing a recording medium, central portions of the solid electrode layer 34 and the solid second antiferromagnetic layer 33 shown in the figure are ground by RIE or the like, and the area having the length L is formed.

The RIE for etching the layers may be stopped immediately after the nonmagnetic layer 32 is exposed at the central portion D as shown in FIG. 18 or may be stopped immediately after the third antiferromagnetic layer 31 is exposed after the exposed nonmagnetic layer 32 is removed. In addition, in this case, the central portion D of the third antiferromagnetic layer 31 may be slightly ground. Alternatively, as shown in FIG. 18, the second antiferromagnetic layer 33 having a small thickness may remain on the central portion D. However, in this case, the thickness of the second antiferromagnetic layer 33 is controlled so that the total thickness of the second antiferromagnetic layer 33 and the third antiferromagnetic layer 31 is 50 Å or less. Otherwise, a large exchange coupling magnetic field is also generated in the central portion D, and as a result, the magnetization of the central portion D of the free magnetic layer 28 is tightly fixed.

In the step shown in FIG. 18, the inside end surfaces 33c and 34a of the second antiferromagnetic layer 33 and the electrode layer 34 are formed to have inclined or curved surfaces so that the distance L between the portions mentioned above in the width direction is gradually increased from the bottom to the top sides.

In addition, in the step shown in FIG. 18, since the mask layers 61 formed on the solid electrode layer 34 are ground by the influence of RIE or the like, parts of the mask layers 61 having a thickness smaller than that obtained in the film forming step may remain on the second antiferromagnetic layers 33, or the entire mask layers 61 are removed.

As shown in FIG. 18, the track width Tw is determined by the distance L between the bottom surfaces of the second antiferromagnetic layers 33. Since this track width Tw becomes slightly smaller than the distance T3 between the mask layers 61 shown in FIG. 17, the track width Tw can be decreased to a very small value, such as approximately 0.1 to 0.2 µm.

After the step shown in FIG. 18 being finished, the second antiferromagnetic layers 33 are present on the same positions as those shown in FIGS. 2 and 3, that is, are placed over the side portions C of the third antiferromagnetic layer 31 in the front region and the end portion 35a of the backfill gap layer 35 in the back region.

Next, second annealing in a magnetic field is performed. The magnetization direction in this step is the track width direction (X direction in the figure). In this second annealing in a magnetic field, a second magnetic field for application is set smaller than an exchange anisotropic magnetic field of the first antiferromagnetic layer 22 and set larger than the coercive force or anisotropic magnetic field of the free magnetic layer 28, and in addition, the heat treatment temperature is set lower than the blocking temperature of the first antiferromagnetic layer 22. Accordingly, even when the first antiferromagnetic layer 22, the third antiferromagnetic layer 31, and the second antiferromagnetic layers 33 are all formed of the same material, such as a PtMn alloy, while the direction of the exchange anisotropic magnetic field of the first antiferromagnetic layer 22 is set in the height direction (Y direction in the figure), the direction of the exchange anisotropic magnetic field of the third antiferromagnetic layer 31 can be set in the track width direction (X direction in the figure). In this step, for example, the second heat treatment temperature is 250° C., and the magnitude of the magnetic field is 24 kA/m.

As described above, when the second antiferromagnetic layers 33 are formed above the side portions C of the third antiferromagnetic layer 31 in the front region with the nonmagnetic layer 32 provided therebetween, the antiferromagnetic interaction between the side portion C of the third antiferromagnetic layer 31 in the front region and the second antiferromagnetic layer 33 is enhanced, and as a result, the side portion C of the third antiferromagnetic layer 31 in the front region, which does not show any antiferromagnetic characteristics by itself, becomes to exhibit antiferromagnetic characteristics.

Accordingly, by the second annealing in a magnetic field described above, ordered transformation occurs appropriately in the side portions C of the third antiferromagnetic layer 31 in the front region, and hence an exchange coupling magnetic field having an appropriate magnitude is generated between each side portion C of the third antiferromagnetic layer 31 in the front region and the corresponding side portion C of the free magnetic layer 28 in the front region. Hence, the magnetization of each side portion C of the free magnetic layer 28 in the front region is fixed in the track width direction (X direction in the figure).

On the other hand, even by the second annealing in a magnetic field described above, the exchange coupling magnetic field is not directly generated between the third antiferromagnetic layer 31 and the central portion D of the free magnetic layer 28 or the side portion C thereof in the back region.

In the present invention, as described above with reference to FIG. 2, since the magnetization of the side portion C of the free magnetic layer 28 in the back region is not fixed, and the bias magnetic field in this region is decreased, magnetization inversion in the central portion D of the free magnetic layer 28 in the back region can be improved as compared to the past. Accordingly, a magnetic sensor, which can suppress the generation of side reading and improve the reproduction sensitivity of the free magnetic layer 28 in the central portion D as compared to that in the past, can be easily and appropriately manufactured.

Figure 19:
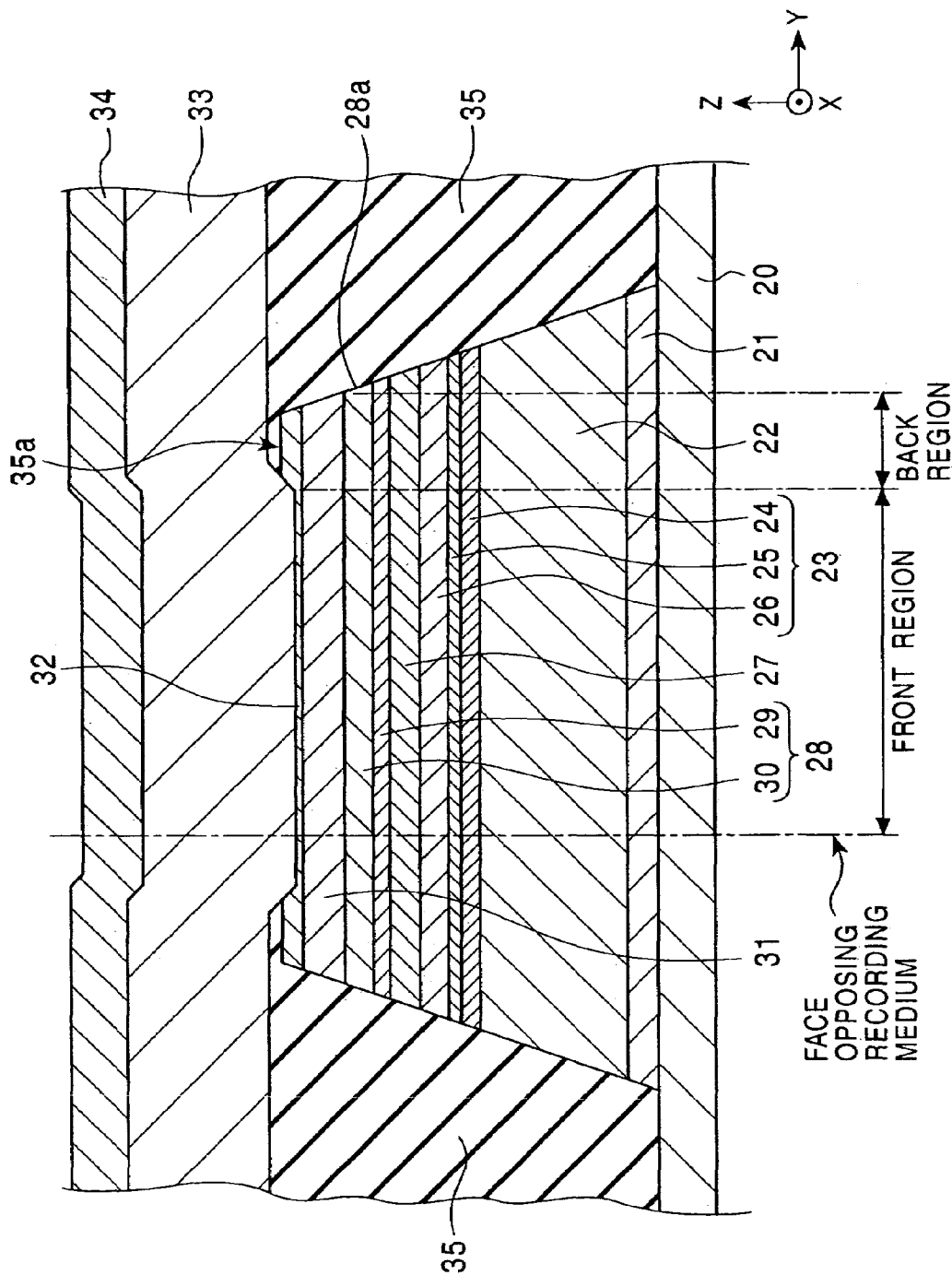
FIG. 19 is a view showing a step following the step shown in FIG. 18 and is a partial, vertical cross-sectional view of the magnetic sensor in a manufacturing step.
Figure 20:
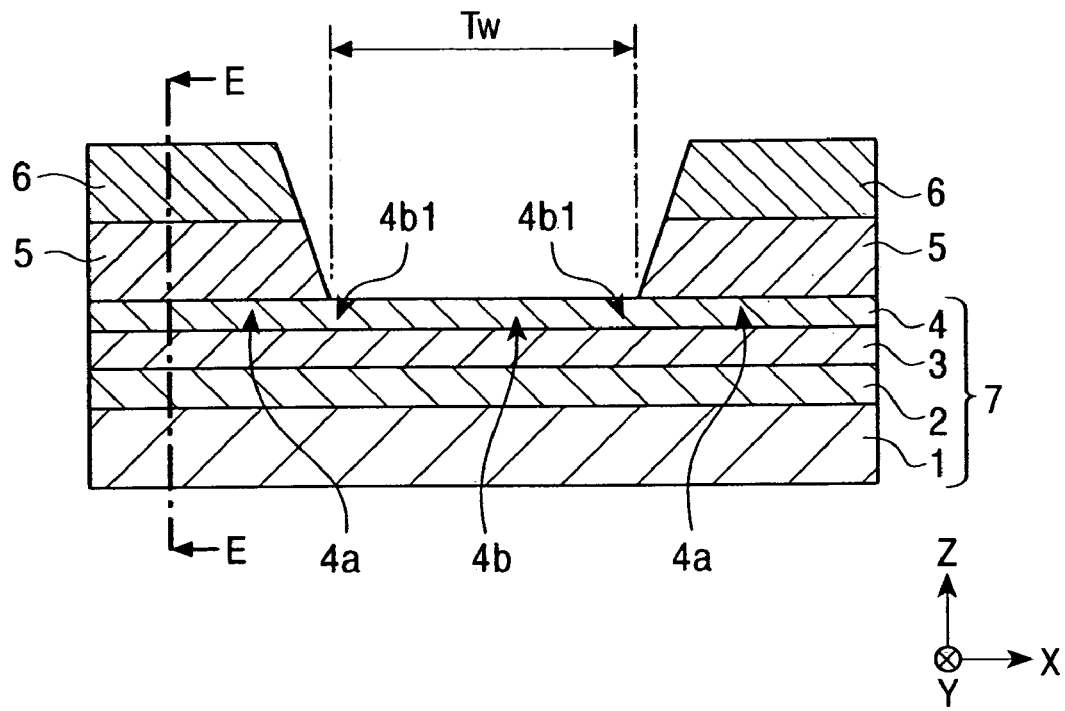
FIG. 20 is a partial cross-sectional view of the structure of a conventional magnetic sensor viewed from a face opposing a recording medium.
Figure 21:
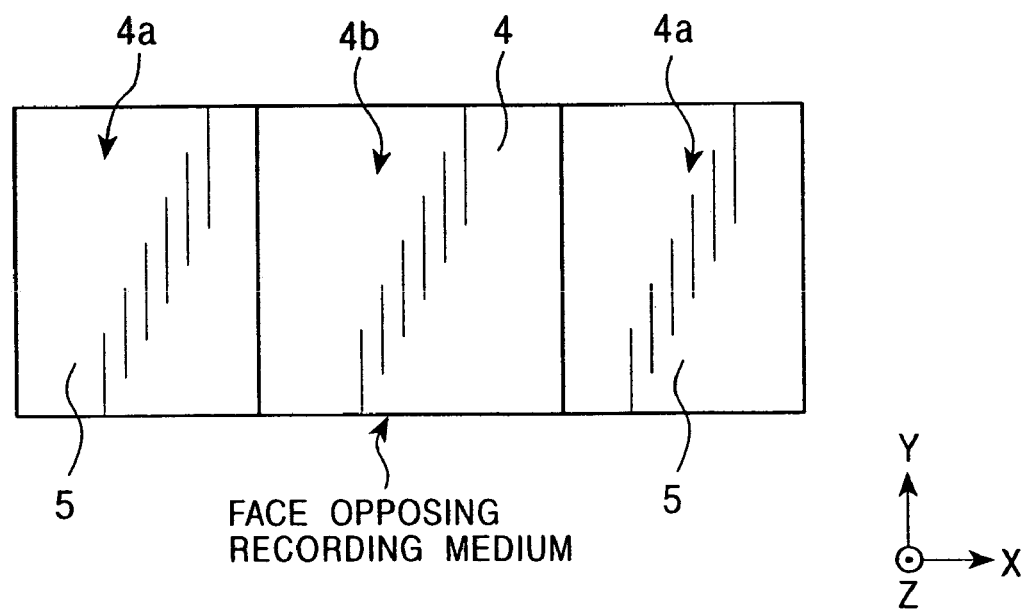
FIG. 21 is a partial plan view of the magnetic sensor shown in FIG. 20, which is viewed from directly overhead.
Figure 22:
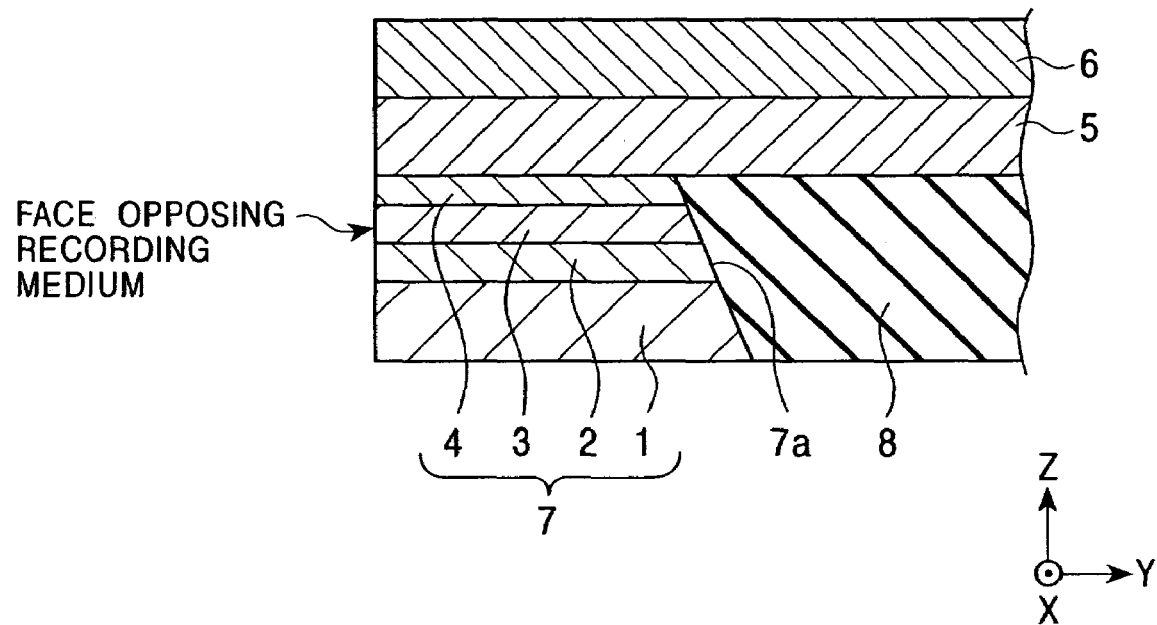
FIG. 22 is a partial, vertical cross-sectional view of the magnetic sensor shown in FIG. 20 taken along the chain line in the direction parallel to the Y-Z plane, the magnetic sensor viewed along the direction indicated by the arrow E.

FIG. 19 is a view showing a final manufacturing step and is a partial, vertical cross-sectional view of the magnetic sensor in the manufacturing step.

In the step shown in FIG. 19. the magnetic sensor is ground along the X-Z plane in the Y direction to the position indicated by the chain line. In this step, a slider (not shown in the figure) formed, for example, of $Al_2O_3$—TiC and provided under the magnetic sensor is also ground.

When the grinding is performed to the position indicated by the chain line shown in FIG. 19, the X-Z plane becomes the "face opposing a recording medium", and hence the magnetic sensor shown in FIGS. 1 to 3 is completed. In this grinding, the position at which the grinding is stopped is determined so that the length of the "front region" in the height direction, shown in FIG. 19, is equivalent to 70% to 80% of the length of the free magnetic layer 28 from the face opposing a recording medium to the back end surface 28a in the height direction. In more particular, the grinding of the magnetic sensor is performed so that the length of the "front region" in the height direction is more than 0.03 µm. As shown in FIG. 19, in the side portion C in the front region, the second antiferromagnetic layer 33 is formed above the third antiferromagnetic layer 31 with the nonmagnetic layer 32 having a very small thickness provided therebetween, and in the side portion C in the back region, the second antiferromagnetic layer 33 is formed on the end portion 35a of the backfill gap layer 35 which is provided above the third antiferromagnetic layer 31.

In addition, the second annealing in a magnetic field may be performed when the step shown in FIG. 19 is completed; however, in this case, as the antiferromagnetic layer, a PtMn alloy is not used, $Ir_{20}Mn_{80}$ or the like is used as the second antiferromagnetic layer 33 and the third antiferromagnetic layer 31.

Among the steps shown in FIGS. 10 to 19, the most characteristic one is the step shown in FIG. 14, and the point is that the end portion 35a of the backfill gap layer 35 is formed on the multilayer film 36. By the step described above, the second antiferromagnetic layers 33 can be formed above the side portions C of the third antiferromagnetic layer 31 in the back region with the end portion 35a of the backfill gap layer 35 provided therebetween.

In particular, in the step shown in FIG. 14, since the lift-off resist 60 is used, the sputtering angle is adjusted in forming the backfill gap layer 35, and the length T1 of the resist layer 60 in the height direction is appropriately adjusted, the backfill gap layer 35 can be formed so that the end portion 35a thereof having a predetermined length is provided on the multilayer film 36.

In addition, after the back end surface 36a of the multilayer film 36 in the height direction is formed into a predetermined shape, by the step in FIG. 14, the backfill gap layer 35 can be simultaneously formed in the height side further from the back end surface 36a of the multilayer film 36 in the height direction and on the multilayer film 36 in the back region, and hence it is preferable since the manufacturing process can be simplified.

In the steps shown in FIGS. 10 to 19, the nonmagnetic layer 32 functioning as an antioxidant film is provided on the third antiferromagnetic layer 31; however, when the material or the film thickness thereof is appropriately adjusted, the nonmagnetic layer 32 can be removed by low-energy ion milling in the step shown in FIG. 15 so that the side portion C of the third antiferromagnetic layer 31 in the front region and the second antiferromagnetic layer 33 can appropriately serve as an integrated antiferromagnetic layer, and as a result, the magnetization control of the free magnetic layer 28 can be more appropriately performed.

In addition, the end portion 32a of the nonmagnetic layer 32 exists under the end portion 35a of the backfill gap layer 35 in the step shown in FIG. 15 and is not influenced by ion milling because of the presence thereof, and hence the original thickness of the end portion 32a obtained in the film forming step can be maintained.

Accordingly, on the side portion C of the third antiferromagnetic layer 31 in the back region, the end portion 35a of the backfill gap layer 35 and the end portion 32a of nonmagnetic layer 32 having the original thickness can be formed, and hence the distance between the second antiferromagnetic layer 33 and the side portion C of the third antiferromagnetic layer 31 in the back region can be effectively increased.

In the case in which a CPP type magnetic sensor is formed, the following steps may be performed. That is, the substrate 20 is formed in the step shown in FIG. 10 as a lower shield layer which also functions as a lower electrode; an insulating layer is formed at a position on which the solid electrode layer 34 is to be formed in the step shown in FIG. 16; and after the step shown in FIG. 18, an upper shield layer, which also functions as an upper electrode, is formed over insulating layers and the region having the length L.

In addition, when the CIP type magnetic sensor described above is used for forming a magnetic head, between the substrate 20 and the seed layer 21 are formed an underlying layer made of an insulating material such as alumina, a lower shield layer made of a magnetic alloy, and a lower gap layer made of an insulating material in that order. The magnetic sensor is formed on this lower gap layer. In addition, on this magnetic sensor lies an upper gap layer made of an insulating material and an upper shield layer made of a magnetic alloy in that order. In addition, on the upper shield layer, an inductive head for writing may be provided.

In addition, the magnetic sensor of the present invention may be used in various applications such as that used in a magnetic head embedded in a hard disc device.

According to the present invention described above in detail, the insulating layer is formed above the two side portions of the free magnetic layer in the back region in the height direction, and the second antiferromagnetic layers are formed from the face opposing a recording medium to the insulating layer in the height direction.

In the front region, which is the region closer to the face opposing a recording medium than the insulating layer, an exchange coupling magnetic field having an appropriate magnitude is generated between the free magnetic layer and the second antiferromagnetic layer, and hence the magnetizations of the side portions of the free magnetic layer in the front region are appropriately fixed in the track width direction. On the other hand, since the insulating layer is provided between each of the second antiferromagnetic layers and the corresponding side portion of the free magnetic layer in the back region, the exchange coupling magnetic field is not generated therebetween, and as a result, unlike the free magnetic layer in the front region, the magnetization of the free magnetic layer in the back region is not tightly fixed.

As a result, the bias magnetic field by an exchange interaction generated inside the magnetic layer is decreased in the free magnetic layer in the back region as compared to that in the front region, and as a result, without decreasing the exchange stiffness constant, the reproduction sensitivity to an external magnetic field of the central portion of the free magnetic layer can be improved as compared to that in the past.

In addition, in the present invention, since the side portions of the free magnetic layer, that is, the regions in which the exchange coupling magnetic fields are generated with the second antiferromagnetic layers, are appropriately formed at positions close to the face opposing a recording medium, the magnetization of each side portion of the free magnetic layer in a region close to the face opposing a recording medium is appropriately fixed in the track width direction, and problems such as the generation of side reading may not arise.

Hence, according to the present invention, even when the track width is increasingly decreased in order to appropriately meet the trend toward higher recording density, a magnetic sensor can be manufactured which can improve the reproduction sensitivity of the free magnetic layer to an external magnetic field while the generation of side reading is suppressed, and which can improve the reproduction output while the higher recording density is realized.

What is claimed is:

1. A magnetic sensor comprising:
   a multilayer film having a first antiferromagnetic layer, a fixed magnetic layer, a nonmagnetic material layer, and a free magnetic layer in that order from a bottom; and
   second antiferromagnetic layers provided on two side portions of the free magnetic layer in a track width direction, wherein back end surfaces of the second antiferromagnetic layers in a height direction, which are in regions in which exchange coupled magnetic fields are generated, are each located at least at a position closer to a face opposing a recording medium than a back end surface of a central portion of the free magnetic layer in the height direction, the central portion being located between the two side portions.

2. The magnetic sensor according to claim 1, wherein a third antiferromagnetic layer is provided on the free magnetic layer, thereby the second antiferromagnetic layers being on two side portions of the third antiferromagnetic layer in the track width direction.

3. The magnetic sensor according to claim 2, wherein a nonmagnetic layer is provided at least one of between the free magnetic layer and the insulating layer in the thickness direction or between a third antiferromagnetic layer and the insulating layer.

4. The magnetic sensor according to claim 3, wherein the nonmagnetic layer comprises at least one element selected from the group consisting of Ru, Re, Pd, Os, Ir, Pt, Au, Rh, and Cr.

5. The magnetic sensor according to claim 2, wherein the third antiferromagnetic layer is formed so as to have a thickness of 20 to 50 Å.

6. A magnetic sensor comprising:
   a multilayer film having a first antiferromagnetic layer, a fixed magnetic layer, a nonmagnetic material layer, and a free magnetic layer in that order from a bottom;
   an insulating layer extending on at least two side portions in a width direction of the free magnetic layer in a back region along a height direction; and
   second antiferromagnetic layers provided on the two side portions from a face opposing a recording medium to the insulating layer.

7. The magnetic sensor according to claim 6, wherein a third antiferromagnetic layer is provided on the free magnetic layer,
   thereby the insulating layer extending on two side portions of the third antiferromagnetic layer in the back region along the height direction, and
   the second antiferromagnetic layers being on the two side portions of the third antiferromagnetic layer from the face opposing a recording medium to the insulating layer.

8. The magnetic sensor according to claim 6, wherein the insulating layer is formed to extend in the height direction further from a back end surface of the multilayer film in the height direction.

* * * * *